United States Patent
Tang et al.

(10) Patent No.: US 9,450,078 B1
(45) Date of Patent: Sep. 20, 2016

(54) FORMING PUNCH-THROUGH STOPPER REGIONS IN FINFET DEVICES

(71) Applicant: Advanced Ion Beam Technology, Inc., Hsin-Chu (TW)

(72) Inventors: Daniel Tang, Fremont, CA (US); Zhimin Wan, Sunnyvale, CA (US); Ching-I Li, Tainan (TW); Ger-Pin Lin, Tainan (TW)

(73) Assignee: ADVANCED ION BEAM TECHNOLOGY, INC., Hsin-Chu (TW)

( * ) Notice: Subject to any disclaimer, the term of this patent is extended or adjusted under 35 U.S.C. 154(b) by 0 days.

(21) Appl. No.: 14/678,874

(22) Filed: Apr. 3, 2015

(51) Int. Cl.
| | |
|---|---|
| H01L 21/38 | (2006.01) |
| H01L 29/66 | (2006.01) |
| H01L 29/10 | (2006.01) |
| H01L 21/306 | (2006.01) |
| H01L 21/265 | (2006.01) |
| H01L 21/324 | (2006.01) |
| H01L 21/762 | (2006.01) |

(52) U.S. Cl.
CPC ... *H01L 29/66795* (2013.01); *H01L 21/26513* (2013.01); *H01L 21/30604* (2013.01); *H01L 21/324* (2013.01); *H01L 21/76237* (2013.01); *H01L 29/1083* (2013.01)

(58) Field of Classification Search
CPC .................. H01L 29/66795; H01L 29/66803; H01L 29/785; H01L 21/823431; H01L 21/823821
See application file for complete search history.

(56) References Cited

U.S. PATENT DOCUMENTS

| | | | |
|---|---|---|---|
| 6,229,148 B1 | 5/2001 | Prall et al. | |
| 6,867,460 B1 | 3/2005 | Anderson et al. | |
| 7,394,078 B2 | 7/2008 | Gupta et al. | |
| 8,278,184 B1 * | 10/2012 | Chen | H01L 21/823431 257/519 |
| 2007/0084564 A1 | 4/2007 | Gupta et al. | |
| 2008/0050897 A1 | 2/2008 | Kottantharayil | |
| 2009/0000946 A1 | 1/2009 | Singh et al. | |
| 2010/0084980 A1 | 4/2010 | Koo | |
| 2010/0176424 A1 | 7/2010 | Yeo et al. | |
| 2011/0006369 A1 | 1/2011 | Sonsky et al. | |
| 2011/0086501 A1 | 4/2011 | Papasouliotis et al. | |
| 2011/0147842 A1 | 6/2011 | Cappellani et al. | |
| 2011/0175152 A1 | 7/2011 | Booth, Jr. et al. | |
| 2011/0195555 A1 | 8/2011 | Tsai et al. | |
| 2011/0248323 A1 | 10/2011 | Ohmi et al. | |

(Continued)

OTHER PUBLICATIONS

Final Office Action received for U.S. Appl. No. 13/592,191, mailed on Feb. 4, 2015, 7 pages.
Non-Final Office Action received for U.S. Appl. No. 13/592,191, mailed on Aug. 15, 2014, 7 pages.
Notice of Allowance received for U.S. Appl. No. 13/592,191, mailed on Jun. 9, 2015, 5 pages.

(Continued)

*Primary Examiner* — Zandra Smith
*Assistant Examiner* — Evan Clinton
(74) *Attorney, Agent, or Firm* — Morrison & Foerster LLP

(57) ABSTRACT

In forming a punch-through stopper region in a fin field effect transistor (finFET) device, a substrate may be etched to form a pair of trenches that define a fin structure. A portion of a first dose of ions may be implanted into the substrate through a bottom wall of each trench to form a pair of first dopant regions that at least partially extend under a channel region of the fin structure. The substrate at the bottom wall of each trench may be etched to increase a depth of each trench. Etching the substrate at the bottom wall of each trench may remove a portion of each first dopant region under each trench. A remaining portion of the pair of first dopant regions under the fin structure may at least partially define the punch-through stopper region of the finFET device.

28 Claims, 17 Drawing Sheets

(56) References Cited

U.S. PATENT DOCUMENTS

2011/0309049 A1 12/2011 Papasouliotis et al.
2012/0000421 A1 1/2012 Miller et al.
2012/0091538 A1 4/2012 Lin et al.
2012/0263887 A1 10/2012 Papasouliotis et al.
2013/0102130 A1 4/2013 Cheng et al.
2013/0126972 A1 5/2013 Wang et al.
2015/0044829 A1* 2/2015 Kim ................ H01L 21/823807
                                                            438/199

OTHER PUBLICATIONS

Non-Final Office Action received for U.S. Appl. No. 13/648,127, mailed on Aug. 20, 2014, 17 pages.
Notice of Allowance received for U.S. Appl. No. 13/648,127, mailed on Jan. 22, 2015, 4 pages.
Notice of Allowance received for U.S. Appl. No. 13/648,127, mailed on Dec. 10, 2014, 11 pages.

* cited by examiner

FORMING PUNCH-THROUGH STOPPER REGIONS IN FINFET DEVICES

BACKGROUND

1. Field

This relates generally to the manufacturing of semiconductor devices and, more specifically, to forming punch-through stopper regions for fin field effect transistor devices.

2. Related Art

As semiconductor manufacturers continue to shrink the dimensions of transistor devices in order to achieve greater circuit density and higher performance, short-channel effects, such as parasitic capacitance and off-state leakage, increasingly impair transistor device characteristics. Fin field effect transistors (finFETs), such as double-gate transistors, tri-gate transistors, and gate-all-around transistors, are a recent development in semiconductor processing for controlling such short-channel effects. A finFET has a fin that protrudes above a substrate surface. The fin forms the body of the finFET device and has fewer paths for current leakage than a planar body. Additionally, the fin creates a longer effective channel width, thereby increasing the on-state current and reducing short channel effects.

FinFET devices may be formed on bulk semiconductor substrates. One issue of forming finFET devices on bulk semiconductor substrates may be the existence of a leakage path at the bottom of the fin where gate control terminates. This leakage path may cause significant sub-threshold punch-through leakage (e.g., short channel leakage effect) and may prohibit further scaling of the channel length. To substantially reduce punch-through leakage, a punch-through stopper region may be formed at the base of the fin using an ion implant process. One conventional method of forming a punch-through stopper region may be to implant a high concentration of dopant ions into the substrate prior to forming the fin. In particular, the dopant ions may be implanted at a target depth that coincides with the base of the subsequently formed fin. However, due to the implant depth profile following an approximate Gaussian distribution, there may be a concentration gradient of dopant ions implanted between the surface of the substrate and the target depth. This may result in a non-uniform dopant profile across the active channel region of the subsequently formed fin, which may cause undesirable variations in the threshold voltage across the height of the resultant fin channel.

SUMMARY

Processes for forming punch-through stopper regions in finFET devices are provided. In one exemplary process, a substrate may be etched to form a pair of trenches. The pair of trenches may define a fin structure and a cap layer may be disposed on a top surface of the fin structure. A first dose of ions may be implanted such that a portion of the first dose of ions is implanted through a bottom wall of each trench to form a pair of first dopant regions in the substrate. The pair of first dopant regions may extend at least partially under a channel region of the fin structure. The substrate at the bottom wall of each trench may be etched to increase a depth of each trench. Etching the substrate at the bottom wall of each trench may remove a portion of each first dopant region under each trench. A remaining portion of the pair of first dopant regions under the fin structure may at least partially define a punch-through stopper region of a finFET device.

DETAILED DESCRIPTION

The following description is presented to enable a person of ordinary skill in the art to make and use the various embodiments. Descriptions of specific devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Although the following description uses terms "first," "second," etc. to describe various elements, these elements should not be limited by the terms. These terms are only used to distinguish one element from another. For example, a first dopant region could be termed a second dopant region, and, similarly, a second dopant region could be termed a first dopant region, without departing from the scope of the various described examples. The first dopant region and the second dopant region can both be dopant regions and, in some cases, can be separate and different dopant regions.

Exemplary processes for forming punch-through stopper regions in finFET devices are described herein. In one example process, a substrate may be etched to form a pair of trenches that define a fin structure. A dose of ions may be implanted such that a portion of the dose of ions are implanted into the substrate through a bottom wall of each trench to form a pair of dopant regions that at least partially extend under a channel region of the fin structure. The substrate at the bottom wall of each trench may be etched to increase a depth of each trench. Etching the bottom wall of each trench may remove a portion of each dopant region under each trench. A remaining portion of the pair of dopant regions under the fin structure may at least partially define the punch-through stopper region of the finFET device.

By forming dopant regions that at least partially extend under the channel region of the fin structure, an abrupt concentration interface may be formed between the punch-through stopper region and the channel region. Such an abrupt interface may produce desirable electrical characteristics in the finFET device. Further, because the dopant regions extend at least partially under the channel region of the fin structure after implanting the dose of ions, an extra anneal process in addition to the activation anneal process may not be needed to significantly drive implanted ions under the fin structure to form the punch-through stopper region. This may reduce the diffusion of implanted ions from the dopant regions into the channel region, which may reduce undesirable threshold voltage variations across the fin structure.

Figure 1A:
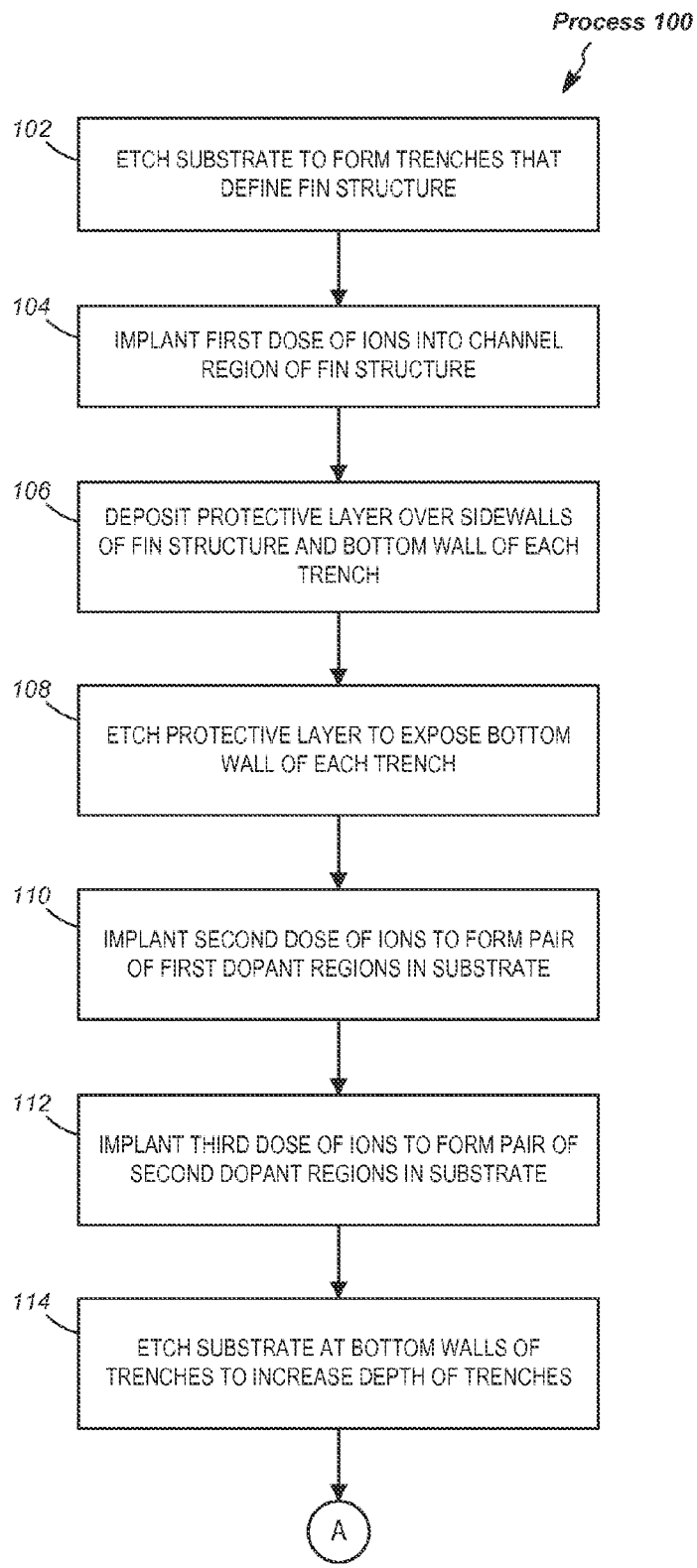
FIGS. 1A-B illustrate an exemplary process for forming a punch-through stopper region in a finFET device.
Figure 1B:
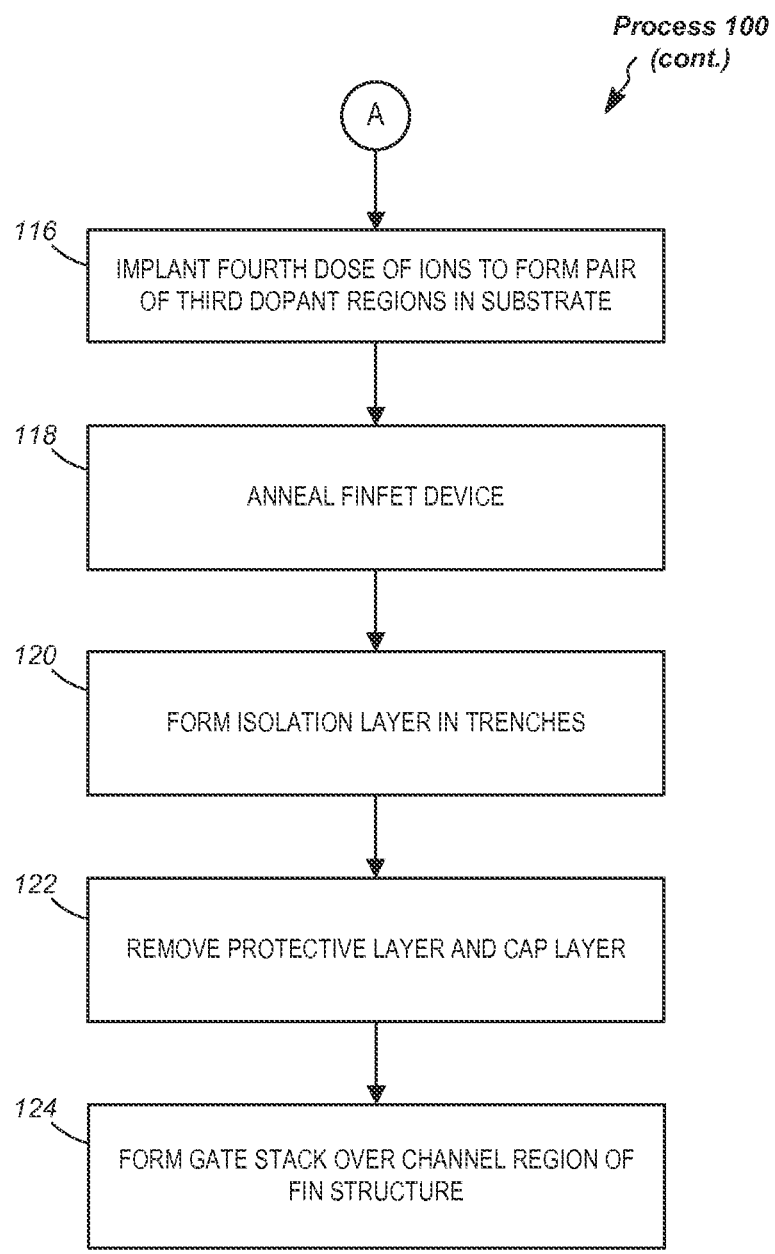

Turning now to FIGS. 1A-B and 2A-K. FIGS. 1A-B illustrate process 100 for forming a punch-through stopper region in finFET device 200 according to various examples. FIGS. 2A-K illustrate cross-sectional views of finFET device 200 at various stages of exemplary process 100. Process 100 is described below with simultaneous reference to FIGS. 2A-K.

Figure 2A:
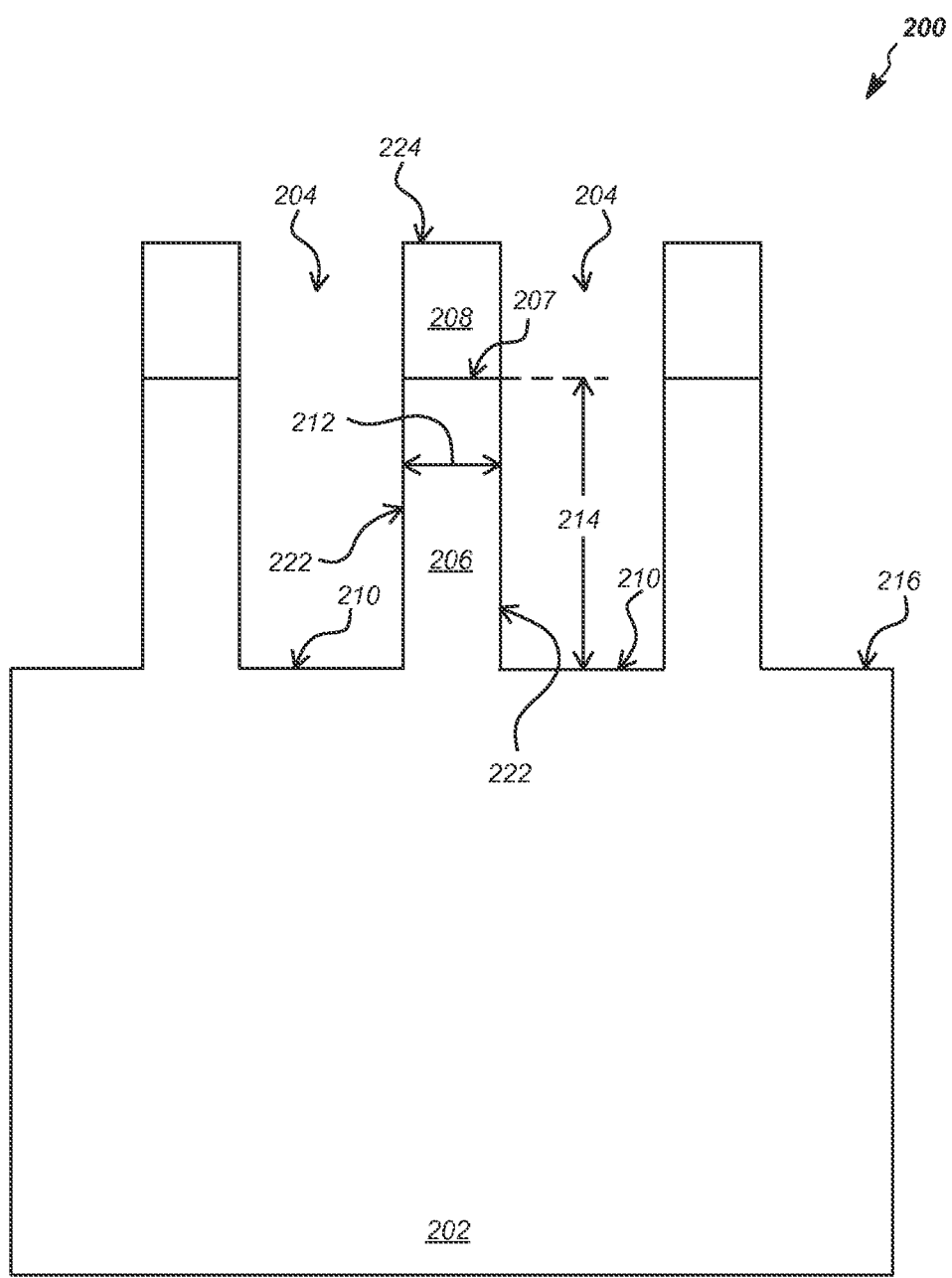
FIGS. 2A-K illustrate cross-sectional views of an exemplary finFET device at various stages of the exemplary process described in FIGS. 1A-B.

At block 102 of process 100 and with reference to FIG. 2A, substrate 202 may be etched to form pair of trenches 204. Pair of trenches 204 may define fin structure 206 where fin structure 206 is disposed between pair of trenches 204. Pair of trenches 204 and fin structure 206 may be formed by conventional semiconductor fabrication processes, such as, but not limited to, photolithography, etch, and chemical vapor deposition (CVD) processes. For example, a hard mask layer (not shown) and cap layer 208 may be initially deposited on substrate 202 using conventional CVD processes and patterned using conventional photolithography and etching processes to expose portions of substrate 202. The exposed portions of substrate 202 may be etched to form pair of trenches 204 that define fin structure 206. Cap layer 208 may remain on top surface 207 of fin structure 206 after substrate 202 is etched to form pair of trenches 204. Cap layer 208 may be desirable to resist ions from implanting into fin structure 206 during subsequent implanting operations (e.g., at blocks 110, 112, or 116). In this way, ions may be selectively implanted into substrate 202 through bottom wall 210 of trenches 204. In some examples, cap layer 208 may be sufficiently thick to resist ions from implanting through cap layer 208 and into fin structure 206 during implanting operations at blocks 110, 112, or 116. In particular, cap layer 208 may have a thickness of 10-30 nm or 15-20 nm.

Fin structure 206 may have a short dimension 212, a height dimension 214, and a long dimension (not shown). The long dimension may be orthogonal to the plane of the drawing in FIG. 2A. Short dimension 212 may also be referred to as the critical dimension of fin structure 206. Fin structure 206 may extend from surface 216 of substrate 202 such that height dimension 214 is approximately orthogonal to surface 216. In some examples, short dimension 212 may be 5-50 nm, height dimension 214 may be 15-150 nm, and the long dimension may be 20-1200 nm. In a specific example, short dimension 212 may be 5-15 nm and height dimension 214 may be 20-50 nm. Further, fin structure 206 may include a channel region, a source region, and a drain region that are disposed at different portions along the long dimension of fin structure 206. In particular, channel region may be disposed between the source region and the drain region. The portion of fin structure 206 depicted in FIGS. 2A-K may correspond to the channel region of fin structure 206.

Substrate 202 and fin structure 206 may comprise one or more semiconductor materials. In some examples, substrate 202 or fin structure 206 may comprise a single crystalline semiconductor material (e.g., silicon, germanium, gallium arsenide, etc.). In other examples, substrate 202 or fin structure 206 may comprise one or more epitaxial single crystalline semiconductor layers (e.g., silicon, germanium, silicon germanium, gallium arsenide, indium phosphide, indium gallium arsenide, etc.). In a specific example, substrate 202 and fin structure 206 may comprise the same semiconductor material (e.g., single crystalline silicon). Cap layer 208 may comprise a material that etches at a significantly lower rate than substrate 202 during etching at block 102. In particular, cap layer 208 may comprise one or more dielectric layers, such as, but not limited to, silicon oxide, carbon doped silicon oxide, silicon nitride, silicon oxynitride, amorphous carbon, or a polymer such as polyimide.

Figure 2B:
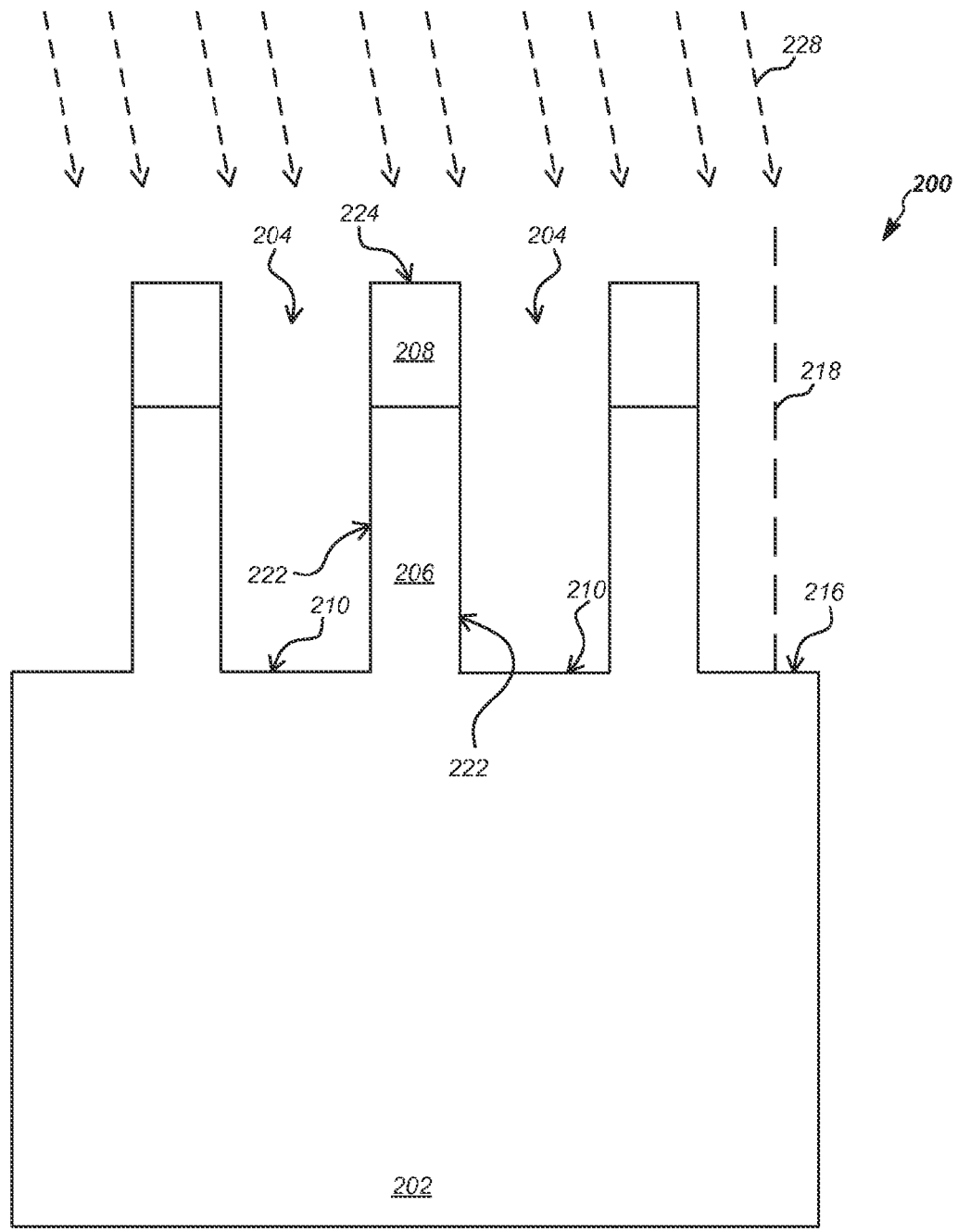

At block 104 of process 100 and with reference to FIG. 2B, a first dose of ions may be implanted such that a portion of the first dose of ions is implanted into the channel region of fin structure 206. Arrows 228 may represent the implanting of the first dose of ions. The ion implant process performed at block 104 may be referred to as a channel implant. During implanting of the first dose of ions, a portion of the first dose of ions may be implanted through cap layer 208 and into the channel region of fin structure 206. In some examples, the first dose of ions may be implanted such that a concentration of ions implanted across the channel region is 1E17-1E20/cm$^3$. Further, in some examples, the first dose of ions may be implanted such that ions implanted into the channel region are uniformly distributed (e.g., a concentration uniformity of less than 3%) across the channel region of fin structure 206.

Block 104 may be performed using a suitable ion implanting process such as, an ion beam implanting process or a plasma doping process. The first dose of ions may be implanted in a single dose or in multiple doses with each dose having a different average implant energy or a different average implant angle. For example, each dose of the first dose of ions may be implanted at an average implant energy of 0.5-15 keV and at an average implant angle of 0-10 degrees with respect to axis 218. As shown in FIG. 2B, axis 218 is perpendicular to surface 216 of substrate 202. In some examples, implanting the first dose of ions at block 104 may be performed as described in U.S. patent application Ser. No. 13/592,191, "Doping a Non-Planar Semiconductor Device," filed on Aug. 22, 2012, the entire disclosure of which is incorporated herein by reference.

The first dose of ions may comprise ions having a conductivity type (e.g., n-type or p-type). The first dose of ions may comprise n-type ions to form a p-channel finFET device. Conversely, first dose of ions may comprise p-type ions to form a n-channel finFET device. Examples of p-type ions include B+, B2+, BF+, or BF2+. Examples of n-type ions include As+, As2+, P+, and P2+.

Although in the present example, block 104 is described as being performed after block 102 and prior to block 106, it should be recognized that in some examples, block 104 may be performed prior to forming trenches 204 and fin structure 206 at block 102. In these examples, a portion of the first dose of ions may be implanted into a region of substrate 202 that coincides with the channel region subsequently formed fin structure 206.

Figure 2C:
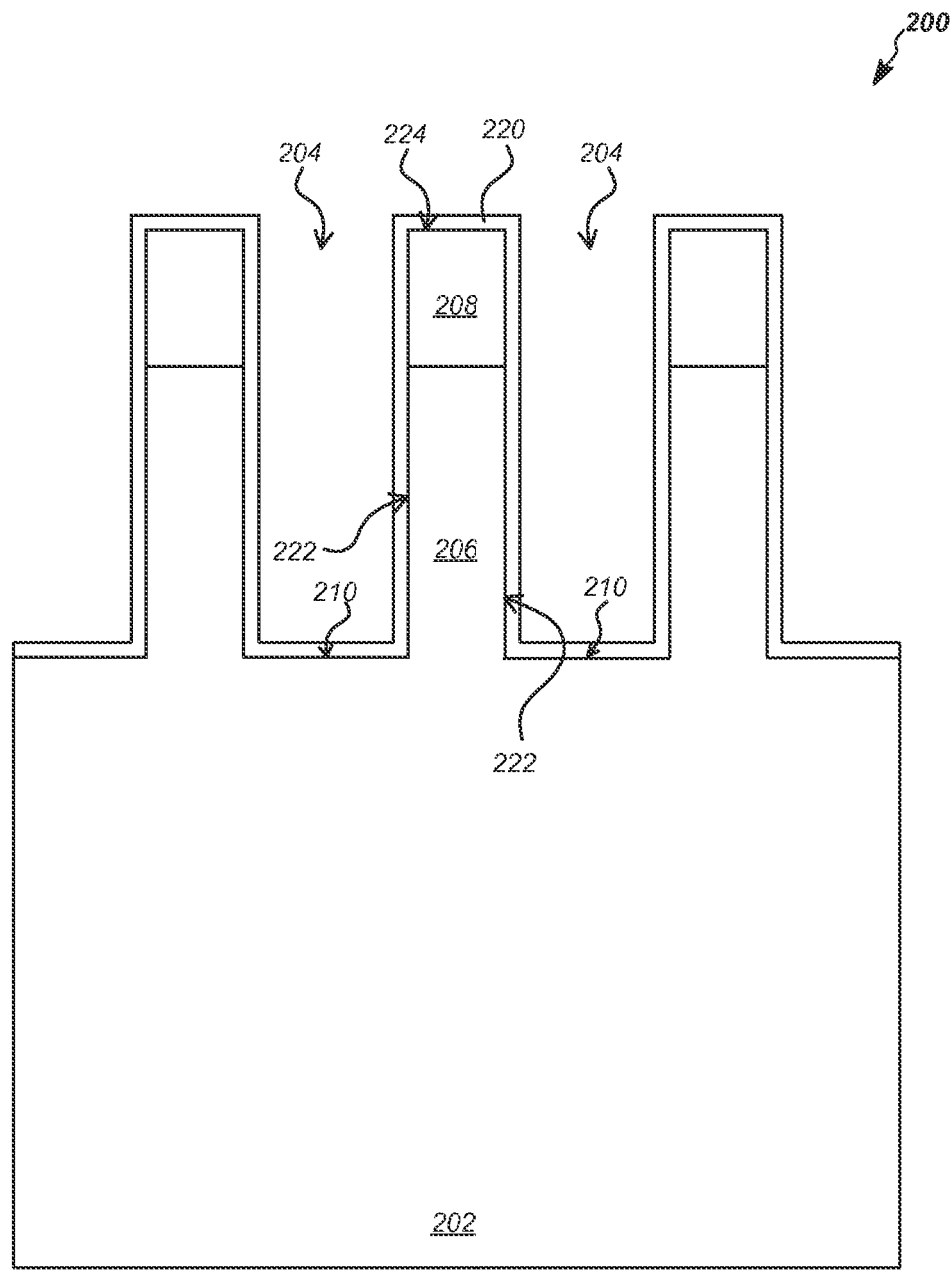

At block 106 of process 100 and with reference to FIG. 2C, protective layer 220 may be deposited over opposite sidewalls 222 of fin structure 206 and over bottom wall 210 of each trench 204. Protective layer may also be deposited over top surface 224 of cap layer 208. In some examples, protective layer 220 may be a conformal layer where the thickness of protective layer 220 is substantially uniform over sidewalls 222 and bottom wall 210 of each trench 204. Further, in some examples, protective layer 220 may be in direct contact with sidewalls 222 and bottom wall 210 of each trench 204.

Protective layer 220 may serve to resist ions from being implanted through protective layer 220 and into fin structure 206 during subsequent implanting operations (e.g., at blocks 110, 112, or 116). Specifically, protective layer 220 may resist ions from being implanted into fin structure 206 through sidewalls 222. Protective layer 220 may comprise one or more dielectric layers such as, but not limited to silicon oxide, silicon nitride, silicon oxynitride, amorphous carbon, or a polymer such as polyimide. In some examples, protective layer 220 may be deposited to a thickness of 2-8 nm.

Block 106 may be performed prior to block 110. Further, in some examples, blocks 106 and 108 may be optional. In particular, subsequent implanting operations may be performed at a substantially vertical implant angle (e.g., 0-15 degrees, 0-10 degrees, 0-5 degrees, or 0-3 degrees with respect to axis 218) and cap layer 208 may be sufficient to resist ions from implanting into fin structure 206. In these examples, blocks 106 and 108 may not be performed.

Figure 2D:
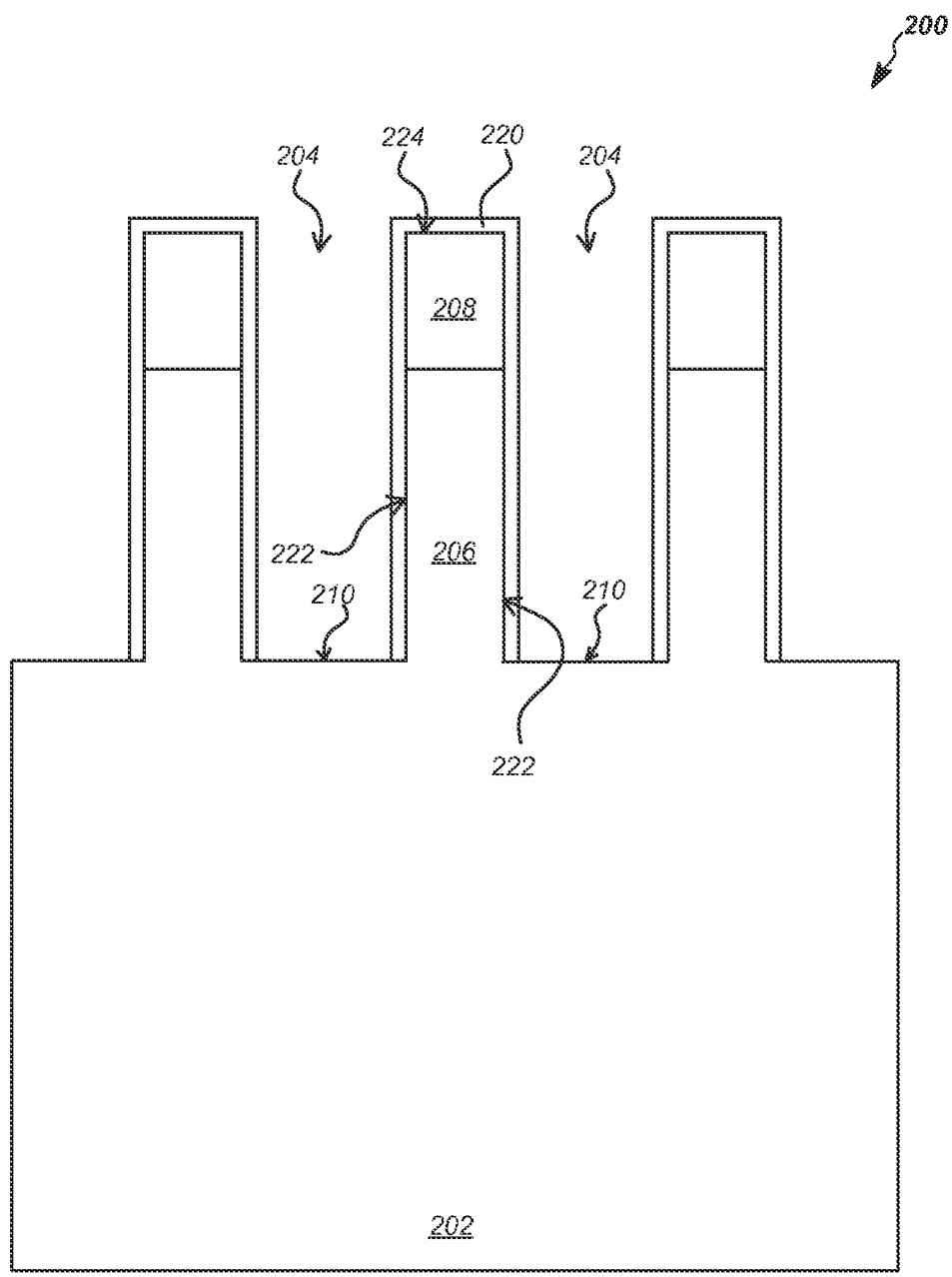

At block 108 of process 100 and with reference to FIG. 2D, protective layer 220 may be etched to expose bottom wall 210 of each trench 204. Further, protective layer 220 may remain on the opposite sidewalls 222 of fin structure 206 after etching protective layer 220 at block 108. For example, an anisotropic etching process may be implemented to remove the portion of protective layer 220 covering bottom wall 210 of each trench 204 while leaving the portion of protective layer 220 covering sidewalls 222 substantially unetched. The remaining protective layer 220 may cover substantially the entire sidewalls 221 of fin structure 206. This may enable ions to be implanted during subsequent implant operations (e.g., at blocks 110, 112, or 116) into substrate 202 through the exposed bottom walls 210 of trenches 204 while resisting ions from being implanted into fin structure 206 through protective layer 220 on sidewalls 222.

Figure 2E:
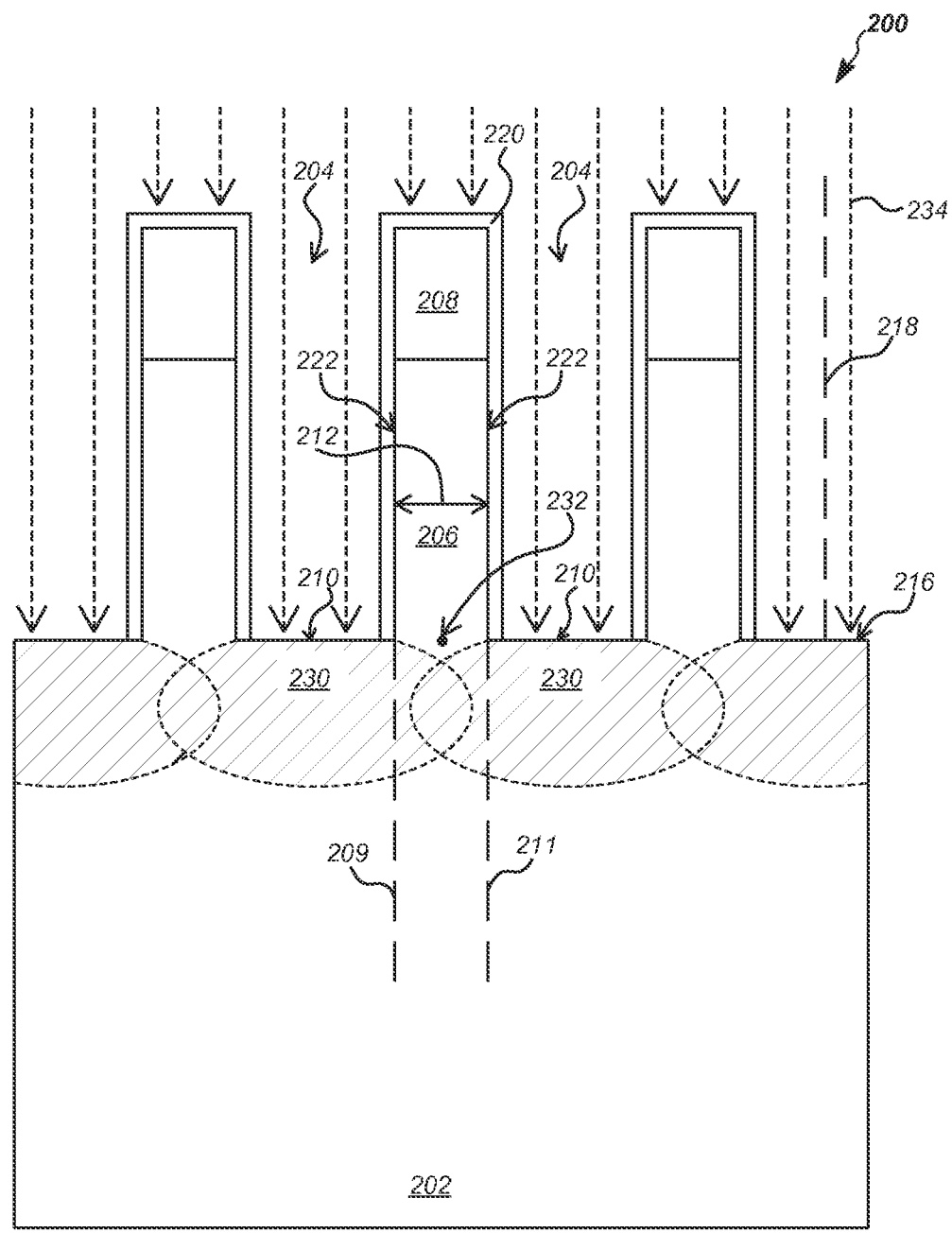

At block 110 of process 100 and with reference to FIG. 2E, a second dose of ions may be implanted such that a portion of the second dose of ions is implanted into substrate 202 through bottom wall 210 of each trench 204 to form a pair of first dopant regions 230 in substrate 202. Arrows 234 may represent the implanting of the second dose of ions. First dopant regions 230 may form at least a portion of the punch-through stopper region of finFET device 200.

The pair of first dopant regions 230 may extend at least partially under the channel region of fin structure 206. More specifically, a portion of each first dopant region 230 may extend under the channel region of fin structure 206 and between first plane 209 aligned with a sidewall 222 of fin structure 206 and second plane 211 aligned with an opposite sidewall 222 of fin structure 206. The pair of first dopant regions 230 may extend under the channel region of fin structure 206 to various extents. In some examples, the pair of first dopant regions 230 may extend under the channel region of fin structure 206 such that the closest distance between the pair of first dopant regions 230 is less than half the critical dimension (short dimension 212) of fin structure 206. In other examples, the pair of first dopant regions 230 may extend under the channel region of fin structure 206 such that the pair of first dopant regions 230 at least partially overlap with each other under the channel region of fin structure 206.

In some examples, the pair of first dopant regions 230 may be formed at least partially under the channel region of fin structure 206 without having to diffuse the implanted ions with an anneal process (e.g., furnace anneal, rapid thermal anneal, laser anneal, etc.) after implanting the second dose of ions at block 110 and before etching the substrate at block 114. Thus, in some examples, pair of first dopant regions 230 may not be subjected to a thermal anneal process after implanting the second dose of ions at block 110 and prior to etching the substrate at bottom wall 210 of each trench 204 at block 114.

As shown in FIG. 2E, first dopant regions 230 may extend continuously from bottom walls 210 of trenches 204 to a target depth (e.g., 15-30 nm) in substrate 202. Further, first dopant regions 230 may extend continuously under fin structure 206 from the bottom wall 210 of one trench 204 to the bottom wall 210 of other trench 204. In some examples, a distance between the pair of first dopant regions 230 and center point 232 at the base of fin structure 206 may be less than the critical dimension (e.g., short dimension 212) of fin structure 206. In particular, the portion of first dopant regions 230 disposed under fin structure 206 may be formed less than 15, 10, or 5 nm from center point 232 at the base of fin structure 206. The base of fin structure 206 may be approximately aligned with bottom wall 210 of each trench 204.

Although implanted ions are generally distributed according to an approximate Gaussian distribution, first dopant regions 230 described herein may refer to portions of substrate 202 implanted with second dose of ions in which the dopant ion concentration exceed a threshold concentration. For example, first dopant regions 230 may define portions of substrate in which the concentration of implanted ions is at least $1E18/cm^3$, $2E18/cm^3$, $5E18/cm^3$, or $7E18/cm^3$. In particular, the portion of first dopant regions 230 under fin structure 206 that extends from a first plane aligned with one sidewall 222 to a second plane aligned with opposite sidewall 222 may have a concentration of implanted ions of at least $1E18/cm^3$, $2E18/cm^3$, $5E18/cm^3$, or $7E18/cm^3$. Such threshold concentrations in first dopant regions 230 may be desirable to form punch-through stopper regions capable of substantially reducing sub-threshold punch-through leakage in finFET device 200.

Figure 3A:
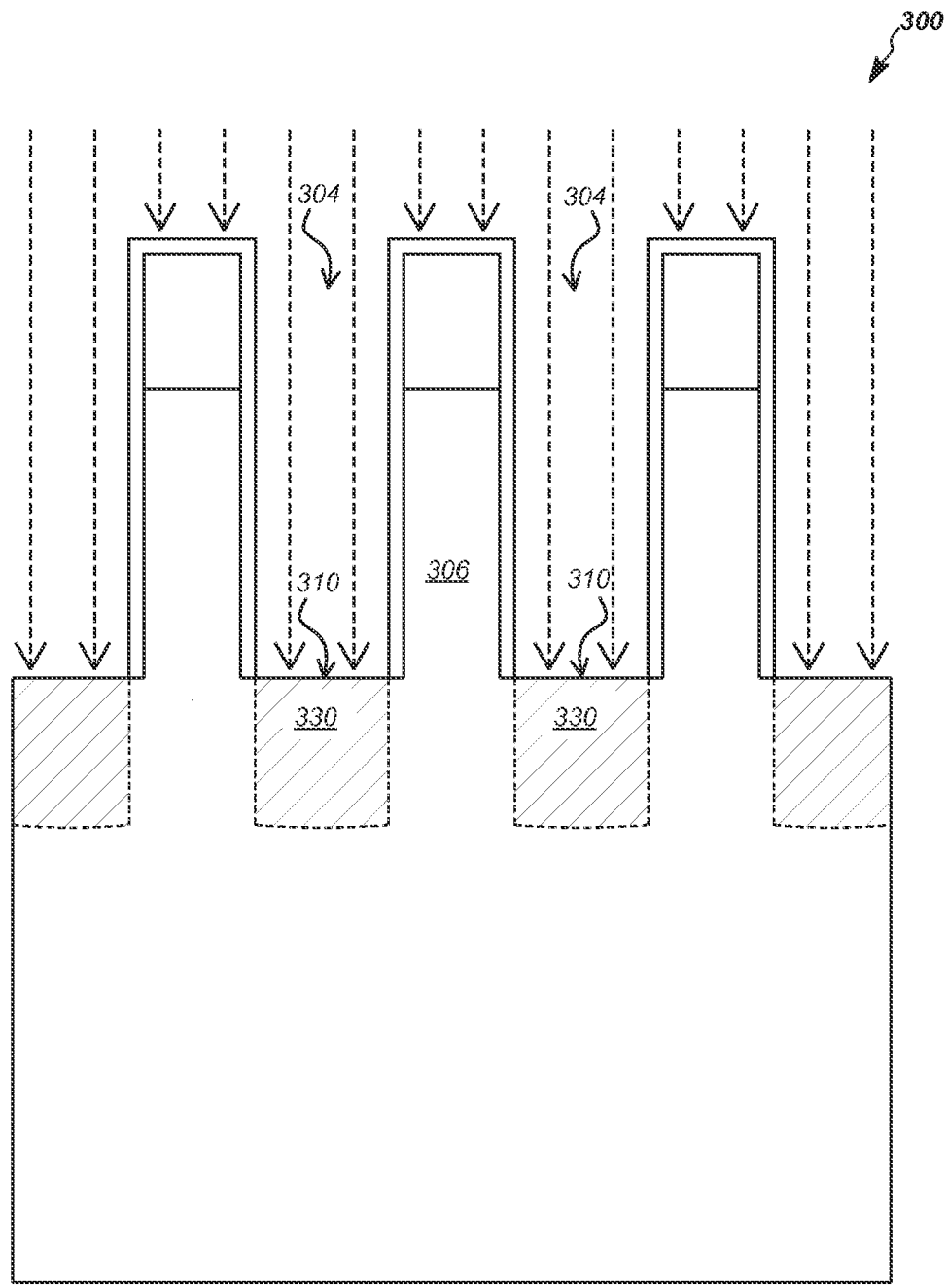
FIG. 3A illustrates a cross-sectional view of an exemplary finFET device with dopant regions that do not extend under the fin structure.
Figure 3B:
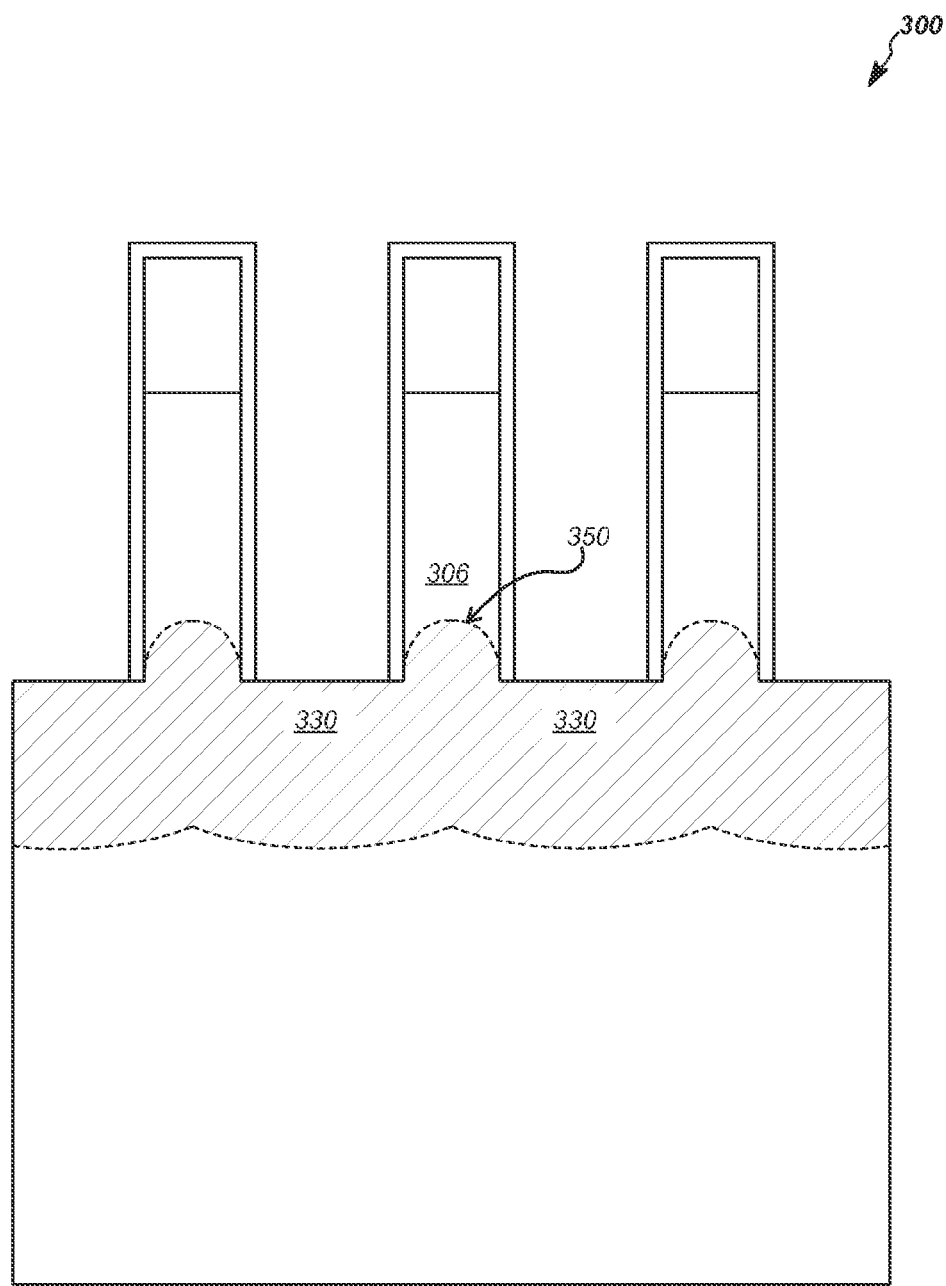
FIG. 3B illustrate a cross-sectional view of an exemplary finFET device with an undesirable dopant profile.

As described above, it may be desirable for first dopant regions 230 to be formed at least partially under the channel region of fin structure 206. This may enable a desirable abrupt dopant interface to form between first dopant regions 230 and the channel region of fin structure 206. In contrast, FIG. 3A depicts exemplary finFET device 300 with dopant regions 330 that do not extend under the channel region of fin structure 306. Further, dopant regions 330 do not overlap with each other under the channel region of fin structure 306. Such dopant regions 330 may be undesirable because a large sub-threshold punch-through leakage path would exist between dopant regions 330. Although dopant regions 330 may be annealed to cause dopant ions to diffuse into the region under fin structure 306 and between dopant regions 330, such annealing may result in dopant ions also diffusing vertically into fin structure 306. For example, FIG. 3B depicts finFET device with a dopant profile that may result from annealing dopant regions 330. As shown, the annealing may cause dopant ions from dopant regions 300 to diffuse vertically into region 350 of fin structure 306. Further, the annealing may cause a gradual concentration gradient of dopants to form between dopant regions 330 and channel region of fin structure 306 (e.g., at region 350). This may result in a non-uniform dopant profile across a portion of the channel region, which may cause undesirable threshold voltage variations. Accordingly, with reference back to FIG. 2E, it may be desirable to form first dopant regions 230 such that first dopant regions 230 at least partially extend under fin structure 206. In some examples, it may also be desirable for the pair of first dopant regions 230 to at least partially overlap with each other under the channel region of fin structure 206. Further, in some examples, it may be desirable not to subject first dopant regions 230 to an anneal process after forming first dopant regions 230 at block 110 and before etching substrate 202 at bottom walls 210 at block 114.

Block 110 may be performed by a suitable ion implanting process such as, for example, an ion beam implanting process or a plasma doping process. In order to form first dopant regions 230 that extend at least partially under the channel region of fin structure 206, the second dose of ions may be implanted such that ions entering bottom wall 210 have sufficient lateral straggle. In particular, a lateral straggle greater than half the critical dimension of fin structure 206 may be desired. A greater lateral straggle may enable a greater dose of ions to be implanted under fin structure 206. In some examples, second dose of ions may be implanted to achieve lateral straggle greater than 4 nm, or greater than 5 nm. Such lateral straggle may be produced under suitable implant conditions. For instance, in examples where the second dose of ions comprises boron ion species, the second dose of ions may be a dose of 1E13 to 3E13 ions/cm$^2$ and the second dose of ions may be implanted at an average implant energy of 1-4 keV. In examples where the second dose of ions comprises phosphorous ion species, the second dose of ions may be a dose of 1E13 to 3E13 ions/cm$^2$ and the second dose of ions may be implanted at an average implant energy of 1.5-12 keV. In examples where the second dose of ions comprises arsenic ion species, the second dose of ions may be a dose of 1E13 to 3E13 ions/cm$^2$ and the second dose of ions may be implanted at an average implant energy of 2-20 keV.

Further, the second dose of ions may be implanted at an angle that is substantially vertical (e.g., 0-5 degrees or 0-10 degrees with respect to axis 218). A substantially vertical implant angle may be desirable to produce sufficient lateral straggle to achieve overlapping first dopant regions 230. Additionally, a substantially vertical implant angle may reduce the portion of ions implanting into sidewalls 222 of fin structure 206 and may increase the portion of ions implanting into substrate 202 through bottom walls 210 of trenches 204. In this way, the concentration of ions implanted into first dopant regions 230 may be greater than the concentration of ions implanted into fin structure 206. In some examples, the portion of the first dose of ions may be implanted through bottom wall 210 at an average implant angle of 0-5 degrees, 0-10 degrees, or 0-15 degrees with respect to axis 218.

The second dose of ions may have the same conductivity type as the first dose of ions. In particular, the second dose of ions may comprise n-type ions to form a p-channel finFET device. Conversely, the second dose of ions may comprise p-type ions to form an n-channel finFET device.

Figure 2F:
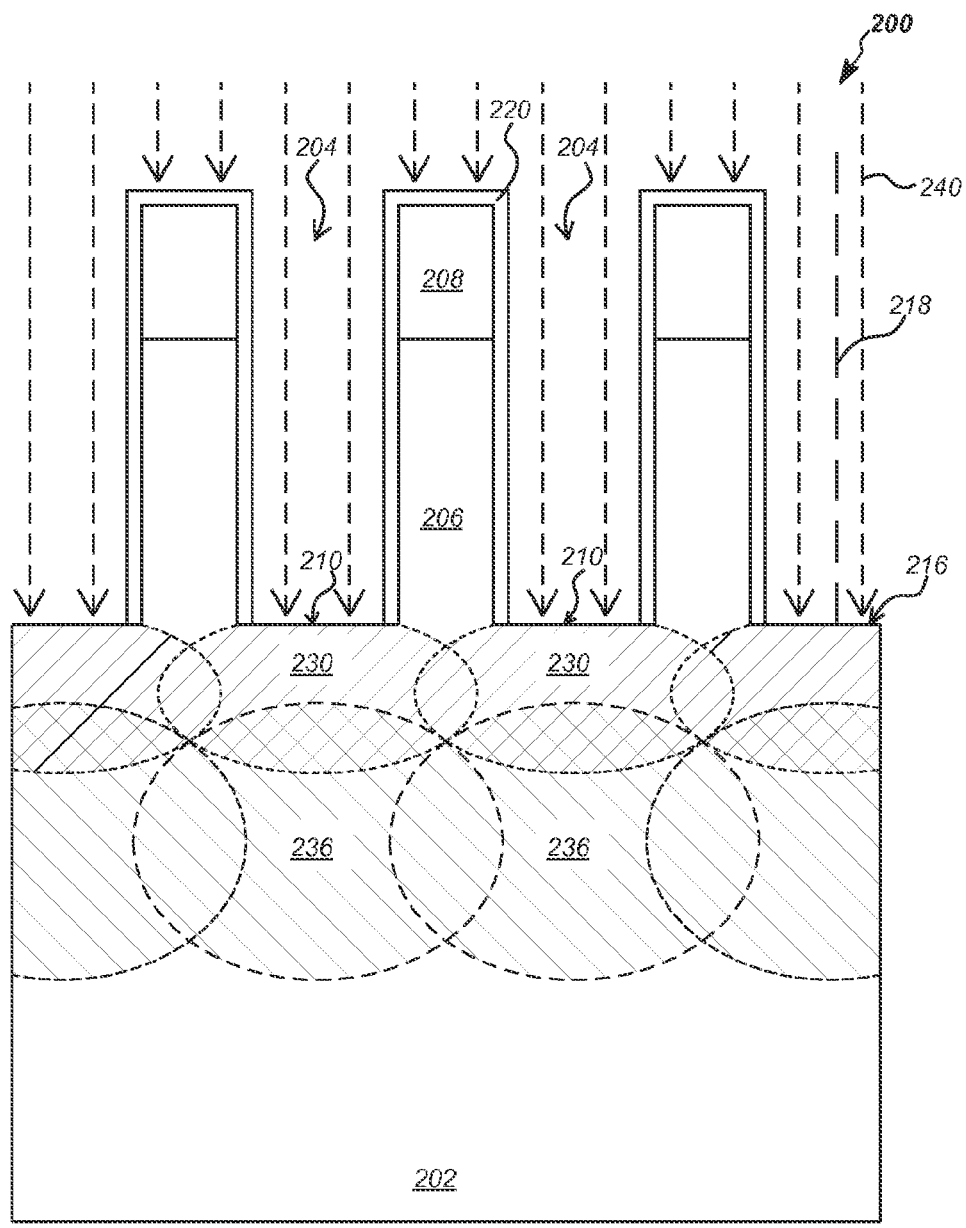

At block 112 of process 100 and with reference to FIG. 2F, a third dose of ions may be implanted such that a portion of the third dose of ions is implanted into substrate 202 through bottom wall 210 of each trench 204 and through first dopant regions 230 to form a pair of second dopant regions 236. Arrows 240 may represent the implanting of the third dose of ions. Second dopant regions 236 may form at least a portion of the punch-through stopper region of finFET device 200. Second dopant regions 236 may refer to portions of substrate 202 implanted with third dose of ions in which dopant ion concentrations exceed a threshold concentration. For example, second dopant regions 236 may define portions of substrate in which the concentration of implanted ions is at least 1E18/cm$^3$, 2E18/cm$^3$, 5E18/cm$^3$, or 7E18/cm$^3$. Second dopant regions 236 may at least partially overlap with first dopant regions 230. In addition, second dopant regions 236 may be formed at least partially below first dopant regions 230. Further, each second dopant region 236 may extend at least partially under the channel region of fin structure 206. In some examples, a closest distance between the pair of second dopant regions 236 may be less than the critical dimension (e.g., short dimension 212) of fin structure 206. In other examples, the pair of second dopant regions 236 may at least partially overlap with each other under the channel region of fin structure 206.

Block 112 may be performed under suitable ion implanting conditions. The third dose of ions may be implanted at a substantially vertical implant angle (e.g., 0-5 degrees or 0-10 degrees with respect to axis 218). In some examples, third dose of ions may be greater than second dose of ions. Further, in some examples, the third dose of ions may be implanted at an average implant energy that is greater than that of the second dose of ions. For instance, in examples where the third dose of ions comprises boron ion species, the third dose of ions may be a dose of 1E13 to 1E15 ions/cm$^2$ and the third dose of ions may be implanted at an average implant energy of 2-15 keV. In examples where the third dose of ions comprises phosphorous ion species, the third dose of ions may be a dose of 1E13 to 1E15 ions/cm$^2$ and the third dose of ions may be implanted at an average implant energy of 5-45 keV. In examples where the third dose of ions comprises arsenic ion species, the third dose of ions may be a dose of 1E13 to 1E15 ions/cm$^2$ and the third dose of ions may be implanted at an average implant energy of 7-80 keV.

The third dose of ions may have the same conductivity type as the first dose of ions or the second dose of ions. In particular, the third dose of ions may comprise n-type ions to form a p-channel finFET device. Conversely, the third dose of ions may comprise p-type ions to form an n-channel finFET device.

Block 112 may be performed prior to block 114. Further, blocks 110 and 112 may be performed after forming trenches 204 and fin structure 206 at block 102. Performing blocks 110 and 112 after block 102 may be advantageous because ions are implanted directly into substrate 202 through bottom wall 210 rather than through the channel region of fin structure 206. This may significantly reduce the amount of ions implanted into the channel region of fin structure 206 at blocks 110 and 112, which may enable a more uniform dopant profile to be achieved across the channel region of fin structure 206. In addition, with fewer ions being implanted through the channel region of fin structure 206, less lattice damage may be caused in the channel region at blocks 110 and 112. This may enable a shorter anneal to be performed at block 118. A shorter anneal may be desirable to reduce the extent at which ions from first dopant regions 230 diffuse into the channel region of fin structure 206. This enables an abrupt dopant inference to be maintained between first dopant regions 230 and the channel region of fin structure 206. Further, by performing blocks 110 and 112 after block 102, the second dose of ions and the third dose of ions may be a smaller dose and may be implanted at a lower implant energy due to the smaller implant depth required. This may be advantageous in reducing manufacturing costs and increasing throughput.

Figure 2G:
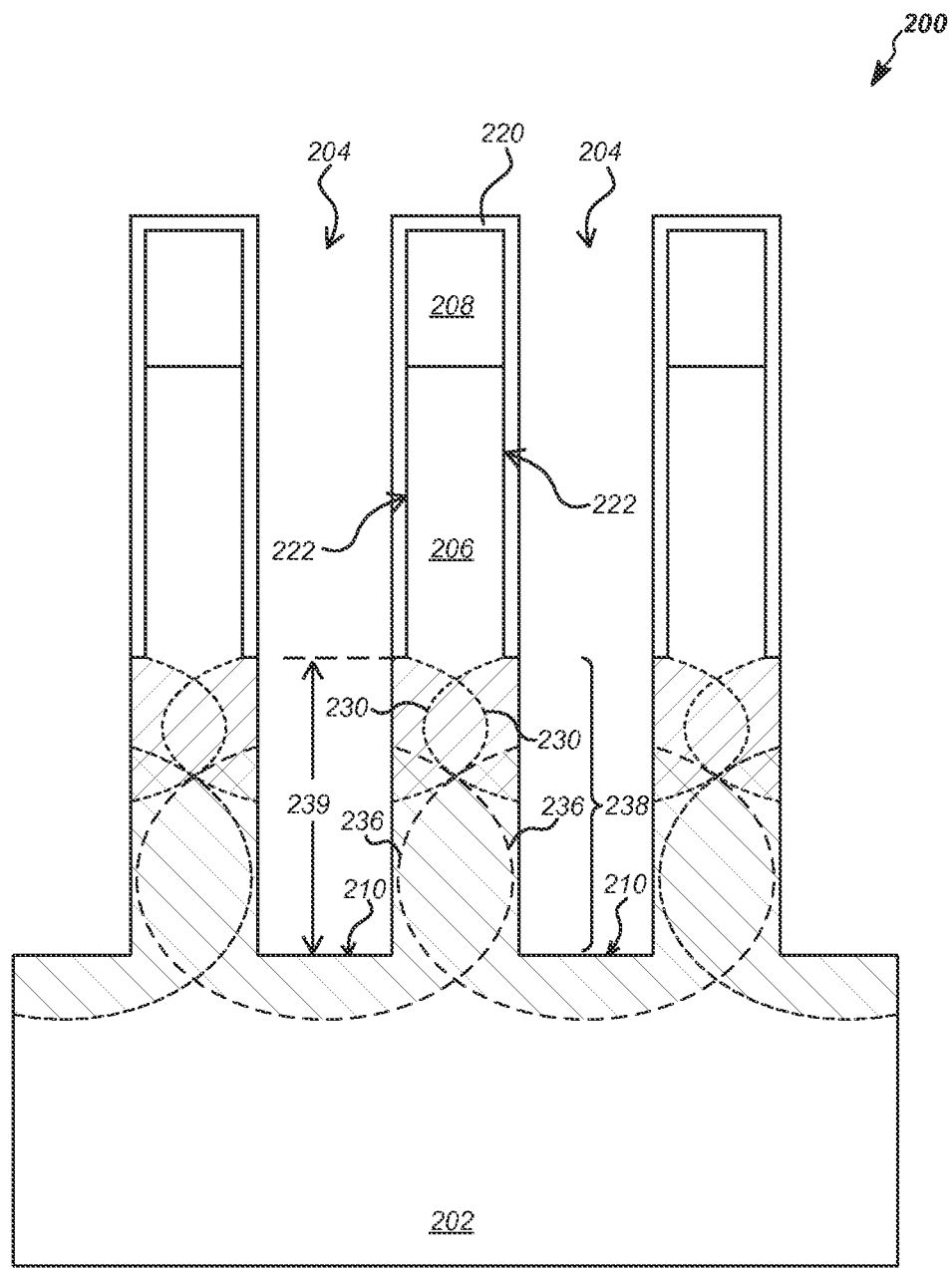

At block 114 of process 100 and with reference to FIG. 2G, substrate 202 at bottom wall 210 of each trench 204 may be etched to increase the depth of each trench 204. As shown in FIG. 2G, the extended portions of trenches 204 may define extended portion 238 of fin structure 206. In some examples, the depth of trenches 204 may be increased such that height dimension 239 of extended portion 238 is 20-80 nm. The sidewalls of extended portion 238 may be approximately aligned with respective outer surfaces of protective layer 220 on sidewalls 222. In examples where protective layer 220 is not deposited (e.g., blocks 106 and 108 are not performed), the sidewalls of extended portion 238 may be approximately aligned with respective sidewalls 222 of fin structure 206.

Etching substrate 202 at bottom wall 210 of each trench 204 may remove a portion of first dopant regions 230 disposed under each trench 204. In addition, a portion of second dopant regions 236 disposed under each trench 204 may be removed. The remaining portions of first dopant regions 230 and/or second dopant regions 236 under fin structure 206 may define the punch-through stopper region of finFET device 200. As shown in FIG. 2G, the remaining portions of first dopant regions 230 and second dopant regions 236 extend substantially across the height dimension 239 of extended portion 238.

Block 114 may be performed using conventional etching processes. In particular, substrate 202 may be etched using an anisotropic dry etch process to increase the depth of trenches 204 without significantly etching sidewalls 222 of fin structure 206. Further, cap layer 208 may serve as a hard mask to resist the etching of fin structure 206 during etching of substrate 202. A portion of cap layer 208 may be removed during etching of substrate 202. In some examples, cap layer 208 may be sufficiently thick after etching substrate 202 to substantially resist ions from implanting into fin structure 206 at subsequent implant operations (e.g., at block 116). In particular, cap layer 208 may have a thickness of at least 15 nm, 20 nm, or 30 nm after etching substrate 202 at block 114. Further, in examples where protective layer 220 is deposited, protective layer 220 may protect sidewalls 222 of fin structure 206 and may resist the etching of sidewalls 222 during etching of substrate 202 at block 114.

Figure 2H:
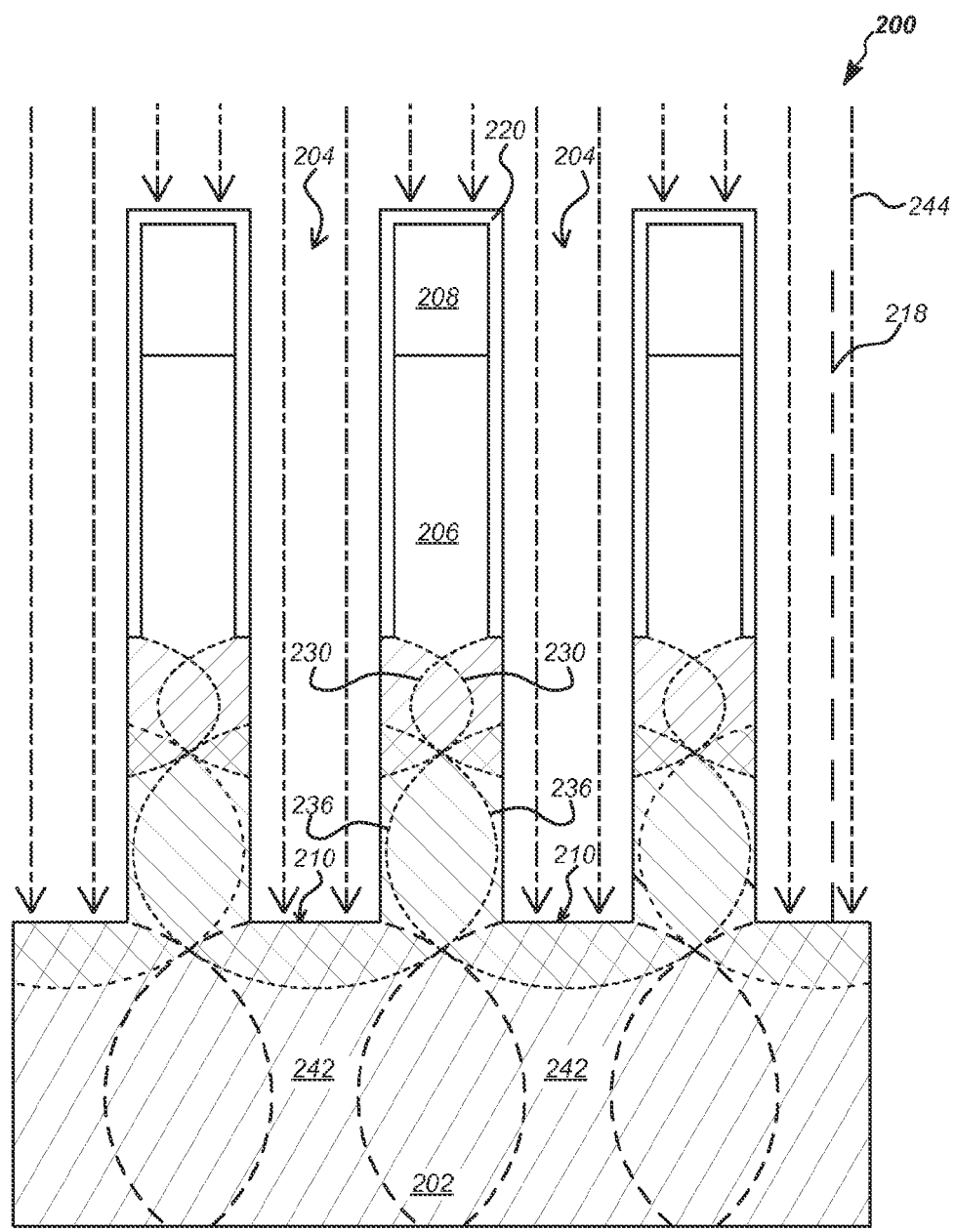

At block 116 of process 100 and with reference to FIG. 2H, a fourth dose of ions may be implanted such that a portion of the fourth dose of ions is implanted into substrate 202 through bottom wall 210 of each trench 204 and through second dopant regions 236 to form a pair of third dopant regions 242 in substrate 202. Arrows 244 may represent the implanting of the fourth dose of ions. Third dopant regions 242 may define a well region in substrate 202. In particular, third dopant regions 242 may refer to portions of substrate 202 implanted with fourth dose of ions in which dopant ion concentrations exceed a threshold concentration. For example, second dopant regions 236 may define portions of substrate in which the concentration of implanted ions is at least $1E18/cm^3$, $2E18/cm^3$, $5E18/cm^3$, or $7E18/cm^3$. Third dopant regions 242 may be formed below second dopant regions 236 and may at least partially overlap with second dopant regions 236. Further, each third dopant region 242 may at least partially extend under the channel region of fin structure 206. In some examples, a closest distance between the pair of third dopant regions 242 may be less than the critical dimension (e.g., short dimension 212) of fin structure 206. In other examples, the pair of third dopant regions 242 may at least partially overlap with each other under the channel region of fin structure 206.

Block 116 may be performed using suitable ion implanting processes. In some examples, the fourth dose of ions may be implanted at a substantially vertical implant angle (e.g., 0-5 degrees, 0-10 degrees, or 0-15 degrees with respect to axis 218). The fourth dose of ions may be implanted at an average implant energy that is greater than that of the second dose of ions or the third dose of ions. Further the fourth dose of ions may be greater than the second dose of ions or the third dose of ions. For instance, in examples where the fourth dose of ions comprises boron ion species, the third dose of ions may be a dose of 1E13 to $1E16$ ions/$cm^2$ and the third dose of ions may be implanted at an average implant energy of 1-30 keV. In examples where the third dose of ions comprises phosphorous ion species, the third dose of ions may be a dose of 1E13 to 1E16 ions/$cm^2$ and the third dose of ions may be implanted at an average implant energy of 1.5-100 keV. In examples where the third dose of ions comprises arsenic ion species, the third dose of ions may be a dose of 1E13 to 1E16 ions/$cm^2$ and the third dose of ions may be implanted at an average implant energy of 2-180 keV.

The fourth dose of ions may have the same conductivity type as the first dose of ions, the second dose of ions, or the third dose of ions. In particular, the fourth dose of ions may comprise n-type ions to form a p-channel finFET device. Conversely, the fourth dose of ions may comprise p-type ions to form an n-channel finFET device.

Block 116 may be performed after block 114. Performing block 116 after block 114 may be advantageous for similar reasons as described above for blocks 110 and 112 with respect to block 102. In particular, fourth dose of ions may be implanted at lower doses and lower average implant energies, which may reduce production costs. In particular, by etching substrate 202 through first dose regions 230 and second dose regions 236 at block 114 to increase the depth of trenches 204, the target range for implanting the fourth dose of ions at block 116 would be only 5-40 nm to form the well region. To achieve such a target range, the average implant energy for implanting the fourth dose of ions may be, in some examples, only 1-10 keV, 1.5-27 keV, and 2-50 keV for boron, phosphorus, and arsenic ion species, respectively. At these average implant energies, it may be feasible to implant the fourth dose of ions at block 116 using a high current implanter rather than a medium current implanter that is typically used for conventional well implants. Utilizing a high current implanter rather than a medium current implanter may further increase throughput and lower production costs. In addition, the lower average implant energies may result in the channel region of fin structure 206 experiencing less implant damage. In some examples, block 116 may be performed after block 108.

At block 118 of process 100, finFET device 200 may be annealed. Block 118 may be performed after block 114. During annealing, implanted ions in the channel region of fin structure 206, first dopant regions 230, second dopant regions 236, and third dopant regions 242 may be electrically activated. Additionally, implant damage (e.g, amorphization and crystalline damaged) in fin structure 206 and substrate 202 may be repaired by means of crystalline re-growth. During annealing, dopant diffusion is preferably minimized to preserve an abrupt dopant interface between the channel region of fin structure 206 and first dopant regions 230. This enables a uniform dopant profile in the channel region of fin structure 206. Further, because ions are implanting at blocks 110, 112, and 116 through bottom wall 210 of trenches 204 rather than through the channel region of fin structure 206, implant damage in fin structure 206 is reduced and thus the duration of anneal at block 118 may be reduced. In some examples, finFET device 200 may be annealed for less than 5, 2, or 1 minute at a temperature of 800-1000 degrees Celsius. In particular, finFET device 200 may be annealed by a rapid thermal anneal, a laser annealing process, or a pulse laser annealing process. The shorter anneal duration may reduce diffusion of the implanted ions, thereby preserving an abrupt dopant interface between the punch-through stopper region and the channel region of fin structure 206.

Figure 2I:
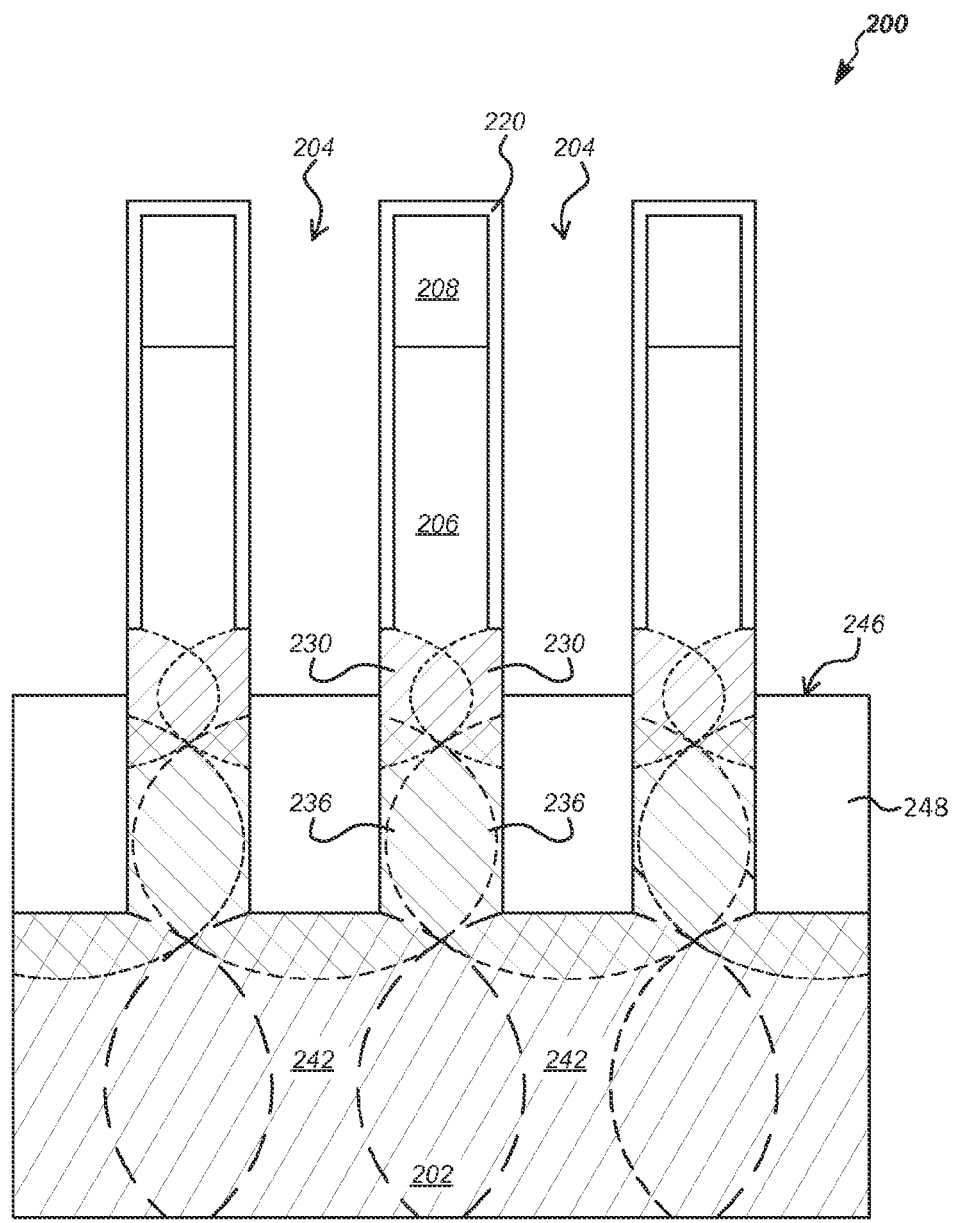

At block 120 of process 100 and with reference to FIG. 2I, isolation layer 248 may be formed in each trench 204.

Isolation layer 248 may be referred to as a shallow trench isolation layer. Isolation layer 248 may comprise one or more dielectric layers, such as, but not limited to, silicon oxide, low-k silicon oxide, porous silicon oxide, doped silicon oxide, silicon nitride, or silicon oxynitride. Isolation layer 248 may be formed using conventional semiconductor processes. In one example, one or more dielectric layers may be initially deposited (e.g., using CVD or spin-on deposition processes) to fill trenches 204. The one or more dielectric layers may then be planarized (e.g., using chemical-mechanical planarization processes) such that the one or more dielectric layers are approximately coplanar with the top surface of cap layer 208 or protective layer 220. Finally, the one or more dielectric layers may be etched back (e.g., using an anisotropic dry etch processes) to form isolation layer 248. In particular, the one or more dielectric layers may be etched back such that top surface 246 of isolation layer 248 is approximately aligned with a portion of first dopant region 230 or a portion of second dopant region 236. In the example shown in FIG. 2I, top surface 246 of isolation layer 248 is aligned with a portion of first dopant region 230.

Figure 2J:
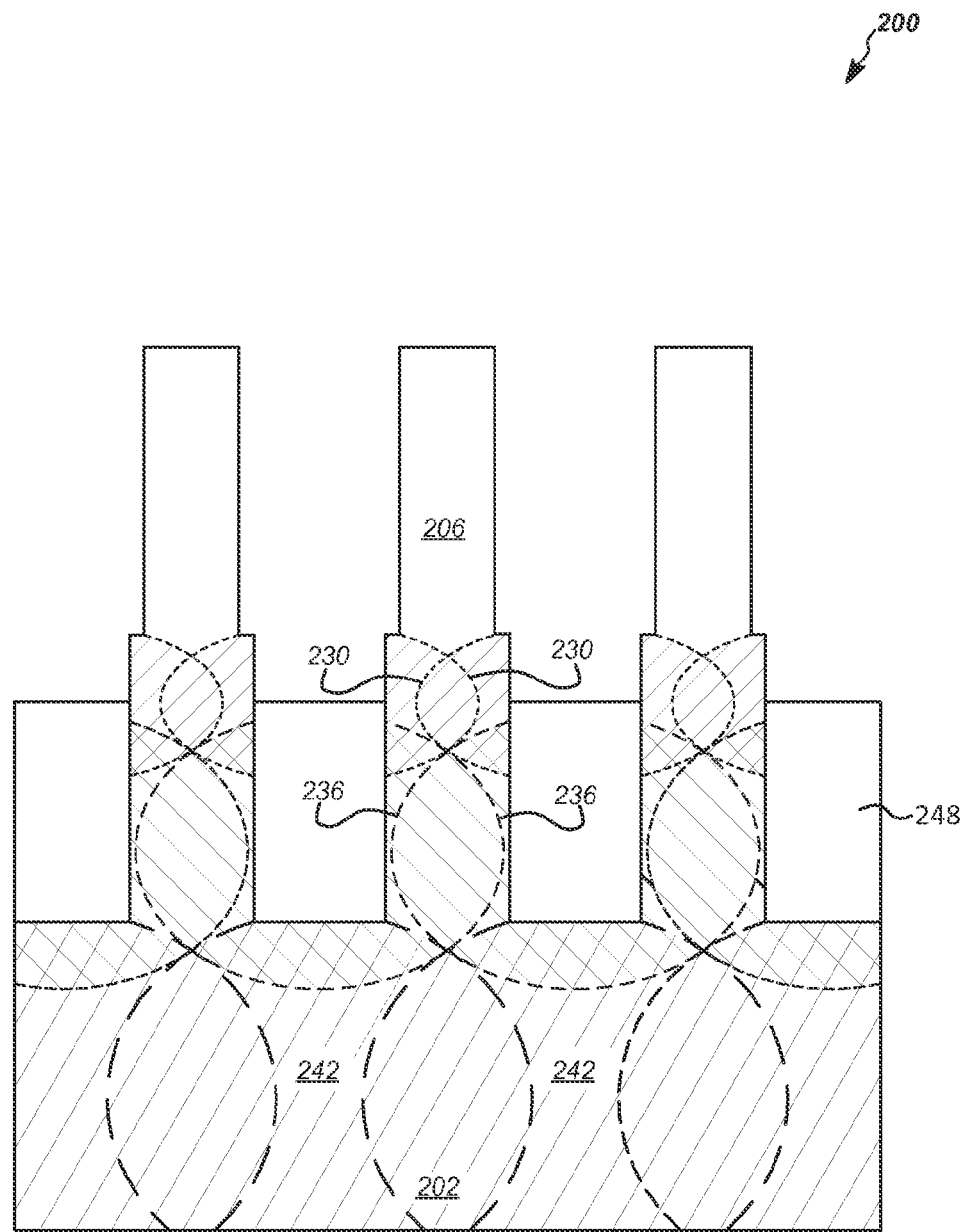

At block 122 of process 100 and with reference to FIG. 2J, cap layer 208 may be removed to expose fin structure 206. Further, in examples where protective layer 220 is deposited at block 106, protective layer 220 may also be removed at block 122. Block 122 may be performed after block 114. In particular, block 122 may be performed after block 120. Cap layer 208 and protective layer 220 may be removed using conventional etching processes.

Figure 2K:
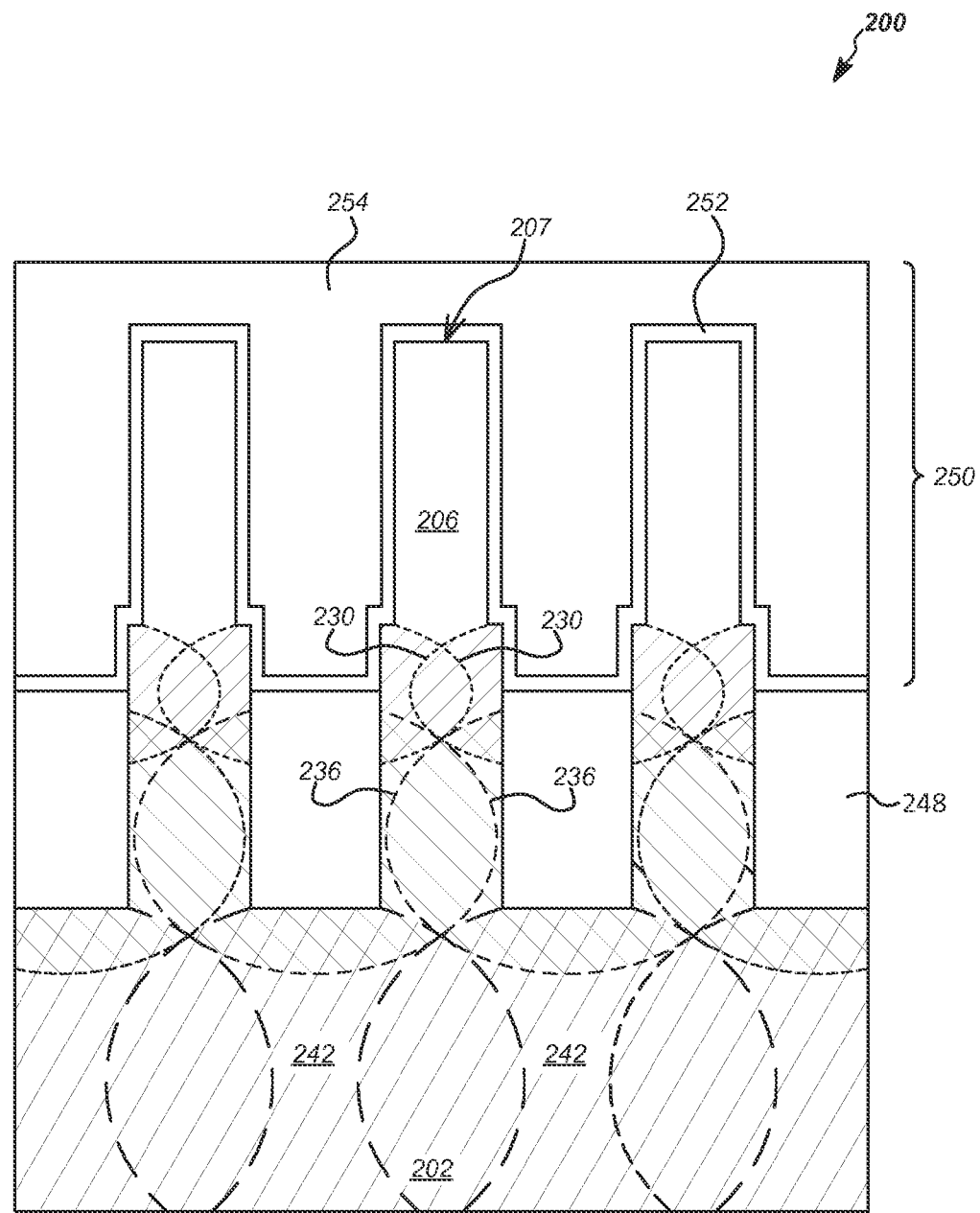

At block 124 of process 100 and with reference to FIG. 2K, gate stack 250 may be formed over the channel region of fin structure 206. Gate stack 250 may include gate electrode 254 disposed over gate dielectric layer 252. Gate dielectric layer 252 may comprise one or more electrically insulating materials such as, but not limited to, silicon oxide, high-k dielectrics, hafnium oxide, and titanium oxide. Gate electrode 254 may comprise one or more electrically conductive materials such as, but not limited to, doped polysilicon, metals, metal nitrides, metal silicides, titanium, tantalum, and tungsten.

Gate stack 250 may be formed by initially depositing gate dielectric layer 252 on top surface 207 and sidewalls 222 of fin structure 206. Gate electrode 254 may then be deposited over gate dielectric layer 252. Gate dielectric layer 252 and gate electrode 250 may be patterned using conventional photolithography and etch processes to form gate stack 250. In some examples, a hard mask layer may be used to pattern gate dielectric layer 252 and gate electrode 254.

It should be recognized that the ion implanting operations described herein (e.g., blocks 104, 110, 112, or 116) may be performed using suitably adapted ion implanting systems, such as the iPulsar® and the iPulsar Plus®, Advanced USJ Enabler system, available from Advanced Ion Beam Technologies Inc. of Hsinchu city, Taiwan. It is contemplated that other suitably adapted ion implanting systems, including those available from other manufacturers, may also be utilized to perform these ion implanting operations.

Although blocks 102 through 124 of process 100 are shown in a particular order in FIGS. 1A-B, it should be appreciated that these blocks may be performed in any order. For example, block 112 may be performed before or after block 110 and block 104 may be performed before or after block 102. Additionally, it should be recognized that in some cases, one or more blocks of process 100 may be optional. For example, as described above, blocks 106 and 108 may be optional. In other examples, blocks 112 and 116-124 may be optional.

Figure 4A:
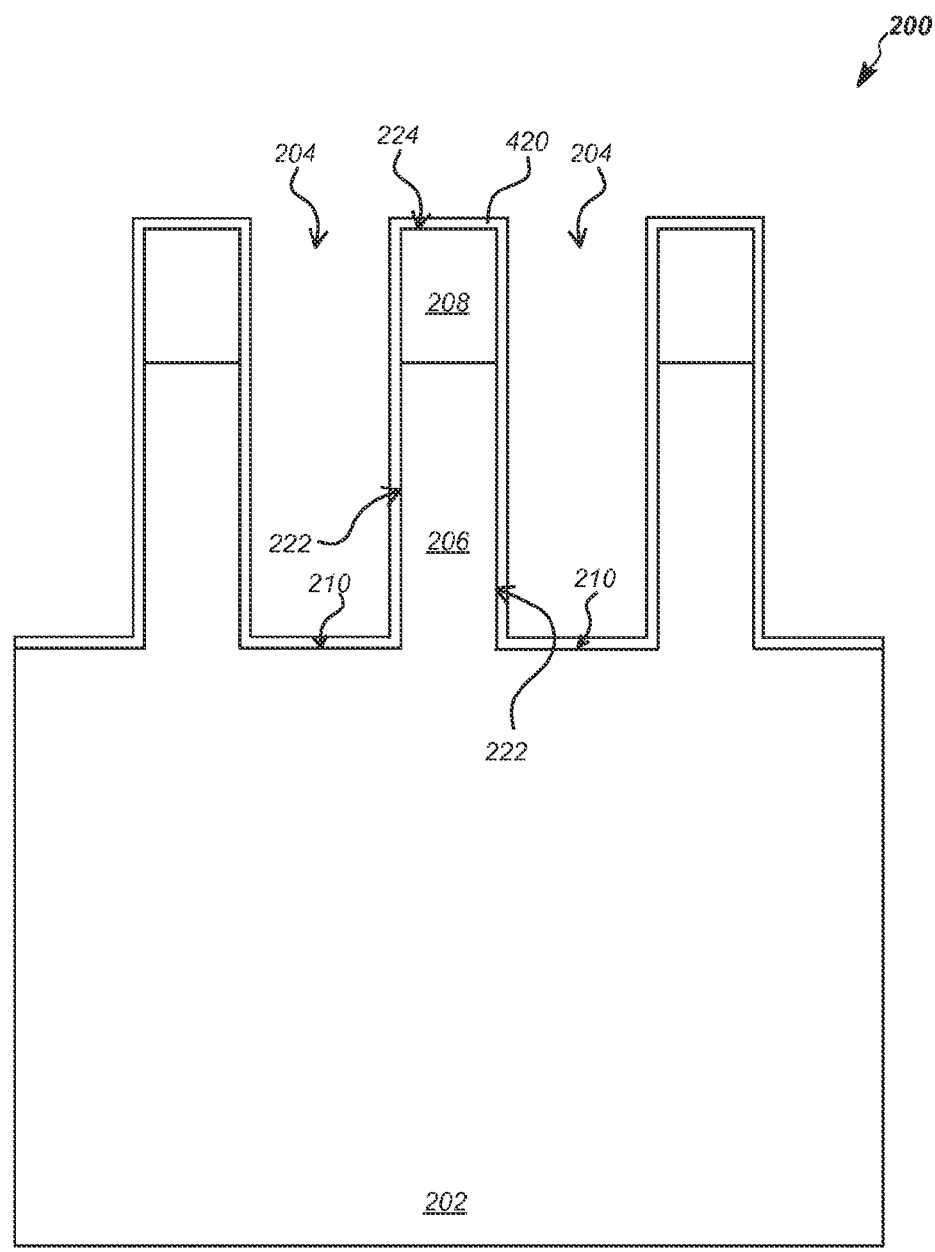
FIG. 4A illustrates a cross-sectional view of an exemplary finFET device with a straggle enhancing layer.

Further, it should be appreciated that additional operations may be performed in process 100. For instance, in some examples, process 100 may include depositing a straggle enhancing layer over the bottom walls of the trenches of the finFET device prior to performing implanting operations (e.g., blocks 110, 112, or 116). For example, FIG. 4A depicts a cross-sectional view of finFET device 200 with straggle enhancing layer 420 deposited over bottom wall 210 of each trench 204. As shown, straggle enhancing layer 420 may extend continuously between opposite sidewalls of each trench 204 to cover substantially the entire bottom wall 210 of each trench 204. Further, straggle enhancing layer 420 may be deposited over sidewalls 222 of fin structure 206 and top surface 224 of cap layer 208. Straggle enhancing layer 420 may be deposited prior to implanting second dose of ions at block 110. In particular, straggle enhancing layer 420 may be deposited after block 102 and before block 110. In examples where straggle enhancing layer 420 is deposited, protective layer 220 may not be deposited. Thus, blocks 106 and 108 may not be performed in examples where straggle enhancing layer is deposited.

Figure 4B:
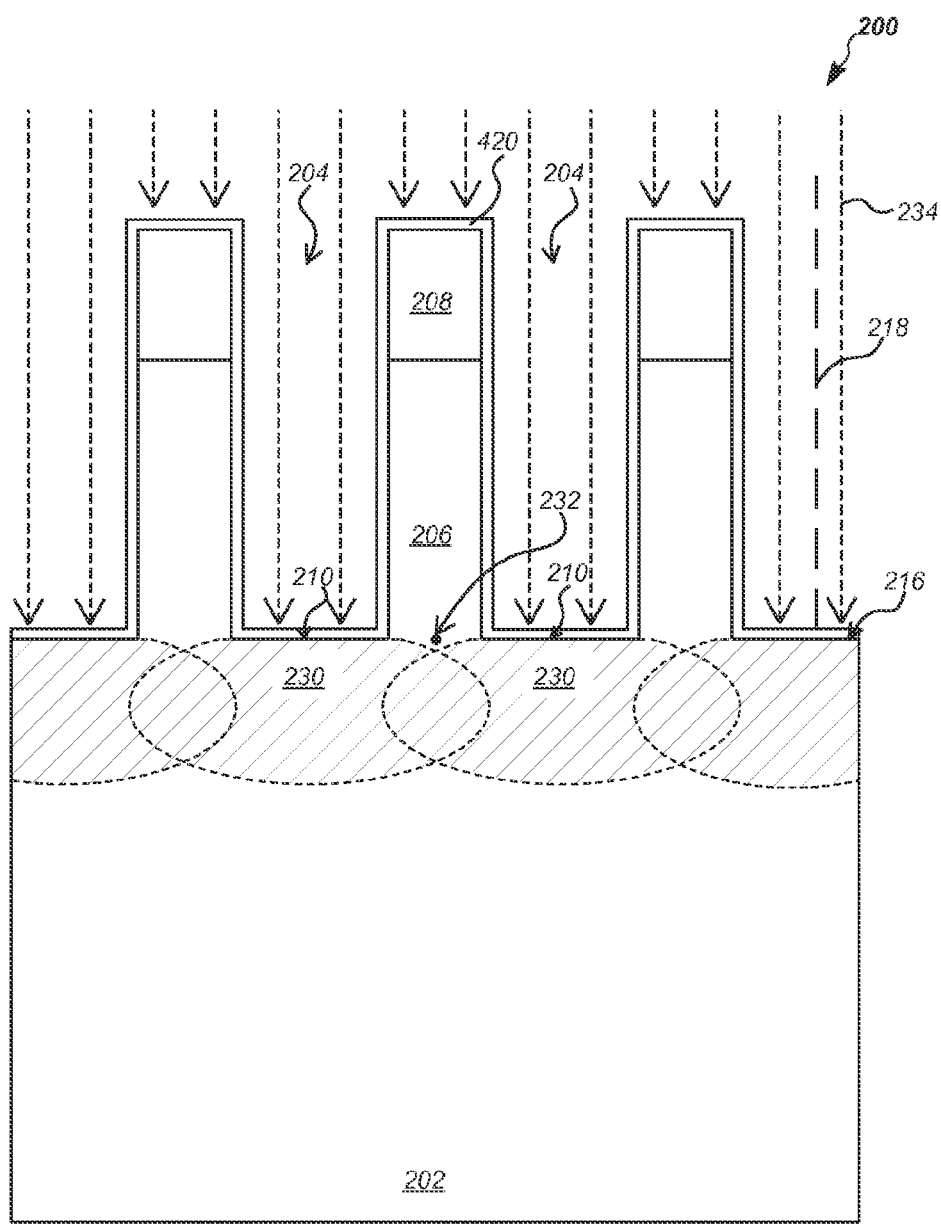
FIG. 4B illustrates dopant regions being formed in an exemplary finFET device with a straggle enhancing layer.

In some examples, at block 110, the portion of the second dose of ions that is implanted into substrate 202 through bottom wall 210 may be implanted through straggle enhancing layer 420. For example, with reference to FIG. 4B, the portion of second dose of ions implanted into substrate 202 through bottom walls 210 may be implanted through straggle enhancing layer 420 to form first dopant regions 230 in finFET device 200. In these examples, straggle enhancing layer 420 may serve to increase the lateral straggle of ions implanted into substrate 202 through bottom wall 210. As shown in FIG. 4B, the increased lateral straggle may increase the overlap between first dopant regions 230. As described above, increasing lateral straggle of ions during implanting of second dose of ions may be desirable to produce first dopant regions 230 that extend at least partially under the channel region of fin structure 206. Further, increasing the lateral straggle during implanting may enable first dopant regions 230 to at least partially overlap under the channel region of fin structure 206 and be formed closer to the base of fin structure 206, which may produce desirable electrical characteristics in finFET device 200. Straggle enhancing layer 420 may be particularly desirable for implanting heavier ions (e.g., arsenic based ions) that intrinsically produce less lateral straggle. In this way, second dose of ions comprising heavier ions may be implanted to form overlapping first dopant regions 230 without having to increase the implant dose or implant energy excessively to produce sufficient lateral straggle. This may be advantageous in reducing production costs and increasing throughput.

In some examples, straggle enhancing layer 420 may comprise a material that is denser than substrate 202. In particular, the average molar mass of straggle enhancing layer 420 may be greater than the average molar mass of substrate 202. For example, straggle enhancing layer 420 may comprise one or more elements each having an atomic mass greater than 30, 68, or 75. In a specific example, straggle enhancing layer 420 may comprise germanium. Such heavier elements may be desirable for producing greater ion scattering and thus greater lateral straggle as ions are implanted through straggle enhancing layer 420.

Straggle enhancing layer 420 may comprise one or more layers. In some examples, a thin dielectric layer may be deposited between straggle enhancing layer 420 and bottom walls 210 of substrate 202 or between straggle enhancing layer 420 and sidewalls 222 of fin structure 206. In these examples, straggle enhancing layer 420 may directly contact the thin dielectric layer. Further, the thin dielectric layer may directly contact the bottom wall 210 of substrate 202. Alternatively, in other examples, straggle enhancing layer 420 may directly contact bottom walls 210 of substrate or sidewalls 222 of fin structure 206. Straggle enhancing layer 420 may be deposited using conventional chemical vapor deposition, physical vapor deposition, or atomic layer deposition processes.

Straggle enhancing layer 420 may be sufficiently thick to produce enough lateral straggle such that first dopant regions 230 at least partially extend under the channel region of fin structure 206. In some examples, straggle enhancing layer 420 may cause sufficient lateral straggle such that first dopant regions 230 at least partially overlap under fin structure 206 at block 110. However, depositing too thick of straggle enhancing layer 420 (e.g., greater than 3 nm or 5 nm) may excessively increase the lateral distance that implanted ions would need to travel from bottom walls 210 to the region under fin structure 206. This may be because straggle enhancing layer 420 increases the effective width of fin structure 206 while reducing the effective distance between opposite sidewalls of each trench 204. Thus, in some examples, straggle enhancing layer 420 may have a thickness of 0.5-3.0 nm. Further, in some examples, straggle enhancing layer 420 may be a conformal layer where the thickness of straggle enhancing layer 420 is substantially uniform over sidewalls 222 and bottom walls 210.

In some examples, at block 112, the portion of the third dose of ions implanted into substrate 204 through bottom wall 210 may also be implanted through straggle enhancing layer 420. Further, the portion of straggle enhancing layer 420 disposed over bottom walls 210 of trenches 204 may be removed prior to etching substrate 202 at block 114. The remainder of straggle enhancing layer 420 disposed over sidewalls 222 of fin structure 206 and top surface 224 of cap layer 208 may be removed prior to forming gate stack 250 at block 124.

It should be recognized that, in some examples, process 100 may further include an anneal operation after block 112 and before block 114. The anneal operation may involve performing a rapid anneal on finFET device 200 to diffuse dopant ions in first dopants regions 230 and cause the pair of dopant regions 230 to at least partially overlap with each other under the channel region of fin structure 206. In this way, a continuous punch-through stopper region may be formed under the channel region of fin structure 206. The anneal would be very short in duration to prevent dopant ions from diffusing upwards into the channel region of fin structure 206. For example, a rapid thermal anneal, a laser anneal, or a pulse laser anneal process may be performed. In some examples, the anneal time may be less than 1 minute, 45 seconds, or 30 seconds.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A method for forming a punch-through stopper region in a fin field effect transistor (finFET) device, the method comprising:
   etching a substrate to form a pair of trenches, the pair of trenches defining a fin structure, wherein a cap layer is disposed on a top surface of the fin structure;
   implanting a first dose of ions such that a portion of the first dose of ions is implanted into the substrate through a bottom wall of each trench to form a pair of first dopant regions in the substrate, wherein each first dopant region extends at least partially under a channel region of the fin structure; and
   etching the substrate at the bottom wall of each trench to increase a depth of each trench, wherein etching the substrate at the bottom wall of each trench removes a portion of each first dopant region under each trench, and wherein a remaining portion of the pair of first dopant regions under the fin structure at least partially defines the punch-through stopper region; and wherein the pair of first dopant regions is not subjected to a thermal anneal process after implanting the first dose of ions and prior to etching the substrate at the bottom wall of each trench.

2. The method of claim 1, wherein a concentration of implanted ions across the pair of first dopant regions is at least $1E18/cm^3$.

3. The method of claim 1, wherein a distance between the pair of first dopant regions and a center point at a base of the fin structure is less than a critical dimension of the fin structure.

4. The method of claim 1, wherein a closest distance between the pair of first dopant regions is less than half a critical dimension of the fin structure.

5. The method of claim 1, wherein the pair of first dopant regions at least partially overlap with each other under the channel region of the fin structure.

6. The method of claim 1, wherein the fin structure is approximately perpendicular to a surface of the substrate, and wherein the portion of the first dose of ions is implanted through the bottom wall of each trench at an average implant angle of 0-10 degrees with respect to an axis perpendicular to the surface of the substrate.

7. The method of claim 1, wherein a concentration of ions of the first dose of ions implanted into the pair of first dopant regions is greater than a concentration of ions of the first dose of ions implanted into the fin structure.

8. The method of claim 1, further comprising:
   prior to implanting the first dose of ions, implanting a second dose of ions such that a portion of the second dose of ions is implanted into the channel region of the fin structure, and wherein the second dose of ions is less than the first dose of ions.

9. The method of claim 8, wherein the first dose of ions and the second dose of ions have a same conductivity type.

10. The method of claim 1, further comprising:
    prior to implanting the first dose of ions:
    depositing a protective layer over opposite sidewalls of the fin structure and the bottom wall of each trench; and
    etching the protective layer to expose the bottom wall of each trench, wherein the protective layer remains over the opposite sidewalls of the fin structure after etching the protective layer.

11. The method of claim 10, further comprising:
    removing the protective layer after etching the substrate at the bottom wall of each trench.

12. The method of claim 1, further comprising:
    prior to etching the substrate at the bottom wall of each trench, implanting a third dose of ions such that a portion of the third dose of ions is implanted into the substrate through the bottom wall of each trench and through the pair of first dopant regions to form a pair of second dopant regions, wherein:

a portion of the pair of second dopant regions is formed below the pair of first dopant regions;

each second dopant region extends at least partially under the channel region of the fin structure; and etching the substrate at the bottom wall of each trench removes a portion of each second dopant region under each trench.

13. The method of claim 12, wherein a concentration of implanted ions across the pair of second dopant regions is at least $1E18/cm^3$.

14. The method of claim 12, wherein the first dose of ions and the third dose of ions have a same conductivity type.

15. The method of claim 1, further comprising:

after etching the substrate at the bottom wall of each trench, implanting a fourth dose of ions such that a portion of the fourth dose of ions is implanted into the substrate through the bottom wall of each trench to form a pair of third dopant regions, wherein the pair of third dopant regions define a well region in the substrate.

16. The method of claim 1, further comprising:

prior to implanting the first dose of ions, depositing a straggle enhancing layer over the bottom wall of each trench, wherein the portion of the first dose of ions is implanted into the substrate through the straggle enhancing layer, and wherein the straggle enhancing layer increases the lateral straggle of the portion of first dose of ions implanted into the substrate.

17. The method of claim 16, wherein the straggle enhancing layer has a thickness of 0.5-3.0 nm.

18. The method of claim 16, wherein the straggle enhancing layer has an average molar mass greater than an average molar mass of the substrate.

19. The method of claim 16, wherein the straggle enhancing layer contains germanium.

20. A method for forming a punch-through stopper region in a fin field effect transistor (finFET) device, the method comprising:

etching a substrate to form a pair of trenches, the pair of trenches defining a fin structure, wherein a cap layer is disposed on a top surface of the fin structure;

implanting a first dose of ions such that a portion of the first dose of ions is implanted into the substrate through a bottom wall of each trench to form a pair of first dopant regions, wherein each first dopant region extends at least partially under a channel region of the fin structure;

implanting a second dose of ions such that a portion of the second dose of ions is implanted into the substrate through the bottom wall of each trench and through the pair of first dopant regions to form a pair of second dopant regions disposed at least partially below the pair of first dopant regions;

etching the substrate at the bottom wall of each trench to increase a depth of each trench, wherein etching the substrate at the bottom wall of each trench removes a portion of each first dopant region under each trench and removes a portion of each second dopant region under each trench, and wherein remaining portions of the pair of first dopant regions and the pair of second dopant regions under the channel region of the fin structure at least partially define the punch-through stopper region; and after etching the substrate at the bottom wall of each trench, implanting a third dose of ions such that a portion of the third dose of ions is implanted into the substrate through the bottom wall of each trench to form a pair of third dopant regions disposed at least partially below the pair of second dopant regions, wherein the pair of third dopant regions define a well region in the substrate.

21. The method of claim 20, wherein a concentration of implanted ions across the pair of first dopant regions, the pair of second dopant regions, and the pair of third dopant regions is at least $1E18/cm^3$.

22. The method of claim 20, wherein the pair of first dopant regions at least partially overlap with each other under the channel region of the fin structure.

23. The method of claim 20, further comprising:

annealing the finFET device after implanting the second dose of ions and prior to etching the substrate to cause the pair of first dopant regions to at least partially overlap with each other under the channel region of the fin structure.

24. The method of claim 20, further comprising:

annealing the finFET device after implanting the third dose of ions to electrically activate implanted ions in the pair of first dopant regions, the pair of second dopant regions, and the pair of third dopant regions.

25. A method for forming a punch-through stopper region in a fin field effect transistor (finFET) device, the method comprising:

etching a substrate to form a pair of trenches, the pair of trenches defining a fin structure, wherein a cap layer is disposed on a top surface of the fin structure;

implanting a first dose of ions such that a portion of the first dose of ions is implanted into the substrate through a bottom wall of each trench to form a pair of first dopant regions in the substrate, wherein each first dopant region extends at least partially under a channel region of the fin structure;

etching the substrate at the bottom wall of each trench to increase a depth of each trench, wherein etching the substrate at the bottom wall of each trench removes a portion of each first dopant region under each trench;

annealing the finFET device after etching the substrate at the bottom wall of each trench to electrically activate implanted ions in the pair of first dopant regions;

forming an isolation layer in each trench;

removing the cap layer; and forming a gate stack over the channel region of the fin structure, the gate stack comprising a gate electrode disposed over a gate dielectric layer.

26. The method of claim 25, wherein the pair of first dopant regions is not subjected to a thermal anneal process prior to etching the substrate at the bottom wall of each trench.

27. The method of claim 25, wherein a concentration of implanted ions across the pair of first dopant regions is at least $1E18/cm^3$.

28. The method of claim 25, wherein the pair of first dopant regions at least partially overlap with each other under a channel region of the fin structure.

* * * * *